(12) United States Patent
Mirkin et al.

(10) Patent No.: US 8,192,794 B2
(45) Date of Patent: Jun. 5, 2012

(54) MASSIVELY PARALLEL LITHOGRAPHY WITH TWO-DIMENSIONAL PEN ARRAYS

(75) Inventors: Chad A. Mirkin, Evanston, IL (US); Peng Sun, Skokie, IL (US); Yuhuang Wang, Silver Spring, MD (US); Steven Lenhert, Karlsruhe (DE)

(73) Assignees: Northwestern University, Evanston, IL (US); Karlsruhe Institute of Technology, Karlsruhe (DE)

( * ) Notice: Subject to any disclaimer, the term of this patent is extended or adjusted under 35 U.S.C. 154(b) by 1118 days.

(21) Appl. No.: 12/000,456

(22) Filed: Dec. 12, 2007

(65) Prior Publication Data
US 2009/0325816 A1 Dec. 31, 2009

Related U.S. Application Data

(63) Continuation-in-part of application No. 11/690,738, filed on Mar. 23, 2007.

(60) Provisional application No. 60/792,950, filed on Apr. 19, 2006.

(51) Int. Cl.
*B05D 5/00* (2006.01)
*G01N 1/28* (2006.01)
(52) U.S. Cl. ......... 427/256; 427/287; 427/2.1; 427/2.11
(58) Field of Classification Search .................. 427/256, 427/287, 2.1, 2.11
See application file for complete search history.

(56) References Cited

U.S. PATENT DOCUMENTS

| | | | |
|---|---|---|---|
| 5,126,574 A | 6/1992 | Gallagher | |
| 5,443,791 A | 8/1995 | Cathcart | |
| 5,666,190 A | 9/1997 | Quate et al. | |
| 5,705,814 A | 1/1998 | Young et al. | |
| 5,835,477 A | 11/1998 | Binnig et al. | |
| 5,981,733 A | 11/1999 | Gamble | |
| 6,024,925 A | 2/2000 | Little | |

(Continued)

FOREIGN PATENT DOCUMENTS

EP 1 388 369 A2 2/2004
(Continued)

OTHER PUBLICATIONS

DPPC compound information was retrieved on May 11, 2011 from PubChem website: http://pubchem.ncbi.nlm.nih.gov/summary/summary.cgi?cid=6138.*

(Continued)

*Primary Examiner* — Dah-Wei Yuan
*Assistant Examiner* — Nga Leung V Law
(74) *Attorney, Agent, or Firm* — Foley & Lardner LLP

(57) ABSTRACT

Massive parallel printing of structures and nanostructures, including lipids, at high speed with high resolution and high quality using two dimensional arrays comprising cantilevers and tip-based transfer of material to a surface. The invention provides a nanolithographic method comprising (1) providing a two-dimensional array of a plurality of cantilevers, wherein the array comprises a plurality of base rows, each base row comprising a plurality of cantilevers extending from the base row, wherein each of the cantilevers comprising tips at the cantilever end away from the base row; wherein the two dimensional array has a support; (2) providing a patterning composition, wherein the composition comprises one or more lipids; (3) providing a substrate; (4) coating the tips of the cantilevers with the patterning composition; and (5) depositing at least some of the patterning composition from the tips to the substrate surface.

51 Claims, 15 Drawing Sheets

U.S. PATENT DOCUMENTS

| | | | |
|---|---|---|---|
| 6,087,274 | A | 7/2000 | Tonucci |
| 6,573,369 | B2 | 6/2003 | Henderson et al. |
| 6,635,311 | B1 | 10/2003 | Mirkin et al. |
| 6,642,129 | B2 | 11/2003 | Liu et al. |
| 6,787,313 | B2 | 9/2004 | Morozov |
| 6,827,979 | B2 | 12/2004 | Mirkin et al. |
| 6,867,443 | B2 | 3/2005 | Liu et al. |
| 6,998,228 | B2 | 2/2006 | Henderson et al. |
| 7,005,378 | B2 | 2/2006 | Van Crocker, Jr. |
| 7,008,769 | B2 | 3/2006 | Henderson et al. |
| 2002/0122873 | A1 | 9/2002 | Mirkin et al. |
| 2003/0005755 | A1 | 1/2003 | Schwartz |
| 2003/0007242 | A1 | 1/2003 | Schwartz |
| 2003/0022470 | A1 | 1/2003 | Liu et al. |
| 2003/0049381 | A1 | 3/2003 | Mirkin et al. |
| 2003/0068446 | A1 | 4/2003 | Mirkin et al. |
| 2003/0113740 | A1 | 6/2003 | Mirkin et al. |
| 2003/0138853 | A1* | 7/2003 | Lahiri et al. .......... 435/7.1 |
| 2003/0162004 | A1 | 8/2003 | Mirkin et al. |
| 2004/0008330 | A1 | 1/2004 | Mirkin et al. |
| 2004/0026681 | A1 | 2/2004 | Cruchon-Dupeyrat et al. |
| 2004/0101469 | A1 | 5/2004 | Demers et al. |
| 2004/0175631 | A1 | 9/2004 | Van Crocker, Jr. |
| 2005/0009206 | A1 | 1/2005 | Mirkin et al. |
| 2005/0035983 | A1 | 2/2005 | Cruchon-Dupeyrat et al. |
| 2005/0235869 | A1 | 10/2005 | Cruchon-Dupeyrat et al. |
| 2005/0255237 | A1 | 11/2005 | Zhang |
| 2006/0014001 | A1 | 1/2006 | Mirkin et al. |
| 2006/0094053 | A1 | 5/2006 | Stamou |
| 2008/0020141 | A1 | 1/2008 | Lenert et al. |
| 2008/0105042 | A1 | 5/2008 | Mirkin et al. |
| 2009/0133169 | A1 | 5/2009 | Mirkin et al. |
| 2009/0143246 | A1 | 6/2009 | Mirkin et al. |
| 2010/0048427 | A1 | 2/2010 | Mirkin et al. |

FOREIGN PATENT DOCUMENTS

| | | |
|---|---|---|
| EP | 1388369 A2 | 2/2004 |
| WO | WO 00/41213 | 7/2000 |
| WO | WO 01/91855 | 12/2001 |

OTHER PUBLICATIONS

Oleic acid compound information was retrieved on May 11, 2011 from PubChem website: http://pubchem.ncbi.nlm.nih.gov/summary/summary.cgi?cid=445639.*

Lang et al, Abstract of "Liposomes composed of partially hydrogenated egg phosphatidylcholines: fatty acid composition, thermal phase behavior and oxidative stability", Chem Phys Lipids, Mar. 1990, 53(1):91-101.*

Lang et al, "A new class of thiolipids for the attachment of lipid bilayers on gold surfaces", Langmuir, 1994, 10 (1), pp. 197-210.*

Piner et al., *Science*, (1999) 283, p. 661-663.

Hong et al., *Science*, (2000) 288, p. 1808-1811.

U.S. Appl. No. 10/366,717, filed Feb. 14, 2003, Eby et al.

U.S. Appl. No. 10/375,060, filed Feb. 28, 2003, Dupeyrat et al.

U.S. Appl. No. 10/307,515, filed Dec. 2, 2002, Mirkin et al.

Gates et al., "New Approaches to Nonfabrication: Molding, Printing, and Other Techniques," *Chem. Rev.* 105, 1171-1196 (2005).

Tseng et al., *J. Vac. Sci. & Tech. B*, (2005) 23, p. 877-894.

Ginger et al., "The Evolution of Dip-Pen Nanolithography," *Agnew. Chem. Int. Ed.*, (2004) 43, p. 30-45.

Vettiger et al., *IBM J. Res. Dev.*, (2000) 44, p. 323.

King et al., *J. Microelectromech. Syst.*, (2002) 11, p. 765.

Minne et al., *J. Vac. Sci. & Tech. B*, (1996) 14, p. 2456-2461.

Minne et al., *Appl. Phys. Lett.*, (1998) 73, p. 1742-1744.

Vettiger et al., *IEEE Trans. Nanotechnology*, (2002) 1, p. 39-55.

Zhang et al., "A massively parallel electrochemical approach to the miniaturization of organic micro- and nanostructures on surfaces," *Langmuir*, 20, 962-968 (2004).

Weinberger et al., *Advanced Materials*, 12, 1600 (2000).

Wenzler et al., T. P. *Rev. Sci. Instrum.*, (1996) 67, p. 4191-4197.

Xia et al., *Chemistry of Materials*, (1995) 7, p. 2332-2337.

Geissler et al., *Langmuir*, (2002) 18, p. 2374-2377.

Zhang et al., *Nano Letters*, (2003) 3, p. 43-45.

Lenhert et al., "Massively Parallel Dip-Pen Nanolithography of Heterogeneous Supported Phospholipid Multilayer Patterns," *Small*, (2007) 3, No. 1, p. 71-75.

International Preliminary Report on Patentability with written opinion mailing date of Oct. 30, 2008 for International Application No. PCT/US2007/007186 (8 pages).

* cited by examiner

θ = angle of bending

MASSIVELY PARALLEL LITHOGRAPHY WITH TWO-DIMENSIONAL PEN ARRAYS

RELATED APPLICATIONS

This application is a continuation-in-part of U.S. regular patent application Ser. No. 11/690,738 filed on Mar. 23, 2007 to Mirkin et al., which is hereby incorporated by reference in its entirety, which claims the priority benefit of U.S. provisional application Ser. No. 60/792,950 filed Apr. 19, 2006 to Mirkin et al., which is hereby incorporated by reference in its entirety.

FEDERAL FUNDING STATEMENT

The present invention was developed with use of federal funding from the following grant agencies and grant numbers: Air Force Office Scientific Research, AFOSR FA9550-05-1-0348; AFOSR 28065-3/W911 NF-04-1-071; National Institutes of Health NIH DPI 0D000285-02; and National Science Foundation NSF-NSEC, EEC-0118025. The federal government reserves rights in the invention.

BACKGROUND

Dip-Pen Nanolithographic® (DPN)® printing has been developed in various embodiments as a scanning probe-based technique that uses, at least in some embodiments, a coated sharp tip such as an atomic force microscope (AFM) tip to pattern surfaces on, for example, the sub-50 nm to many micrometer length scale (see, for example, Piner et al. *Science* 283, 661-663 (1999)). This novel printing technique in its various embodiments can combine soft matter compatibility with the high resolution of scanning probe and AFM methods, thereby affording unique opportunities to use micro- and nano-patterned substrates in a variety of fields ranging from molecular electronics to biomedicine. However, an obstacle in commercially utilizing DPN printing for some applications has been its relatively low throughput (see, for example, Hong et al. *Science* 288, 1808-1811 (2000); Salaita et al. *Small* 1, 940-945 (2005)), a limitation associated with the field of scanning probe lithography in general (see, for example, Gates et al. *Chem. Rev.* 105, 1171-1196 (2005); Tseng et al., *J. Vac. Sci. & Tech. B* 23, 877-894 (2005)). In particular, the DPN method is generally used as a serial method rather than a parallel method, and the exponential complexity and cost arising from individually addressed feedback systems can constrain its accessibility and the rate of patterning. Therefore, a commercial need exists to improve throughput of the DPN method while maintaining its simplicity.

In many cases, the lithography has been to date carried out with one pen on one instrument to transfer a patterning compound or material to the surface. However, one approach has been to use multiple pen systems wherein multiple pens operate in parallel on one instrument. For example, WO 00/41213 to Mirkin et al. describes use of a plurality of tips with a single device, referring to U.S. Pat. No. 5,666,190 to Quate et al. (Stanford) for descriptions of cantilever arrays and nanolithographic application. In addition, WO 01/91855 to Mirkin et al. describes working examples with a plurality of tips, wherein a linear array of eight tips were obtained from a larger wafer block of tips and affixed to a ceramic tip carrier and mounted to an AFM tip holder with epoxy glue.

Salatia et al. *Small,* 2005, 1, No. 10, 940-945 describe parallel printing with 250 pen arrays, 26 pen arrays, and blocks of 26 pen arrays. U.S. Pat. No. 6,642,129 to Liu et al. describes parallel individually addressable probes for nanolithography including linear arrays and two dimensional arrays. The review by Ginger et al. *Angew. Chem. Int. Ed.* 43, 30-45 (2004)) describes 10,000 pen systems.

Massively parallel nanoarray platforms have been noted including a system with 1.2 million pens per four inch diameter wafer. See, for example, Demers et al., *Genetic Engineering News*, vol. 23, no. 15, Sep. 1, 2003, 32.

Parallel probes have also been developed by IBM. See for example, Vettiger et al., *IBM J. Res. Dev.* 2000, 44, 323; King et al., *J. Microelectromech. Syst.* 2002, 11, 765. See also U.S. Pat. No. 5,835,477 to Binnig et al.

However, a need yet exists to improve this approach in view of, for example, the difficulties associated with fabricating large numbers of pens in a confined space including in two dimensional arrays and in adapting the pens to a larger or customized instrument to control the printing process. For example, leveling and alignment of massive numbers of cantilevers and tips is an engineering challenge. The pens must be efficiently produced so that as many of the pens as possible are usable. Fabrication should be convenient, and the pens should be robust for commercial use with a variety of patterning compounds and materials. High rates of patterning structures, including nanostructures, are needed at high resolution and registration. While multiple pen systems have been used for patterning, the number of dots generated by contact has typically been the same as the number of pens. Otherwise, no registration exists between the two sets of dots. A need exists to better demonstrate the writing capabilities of large pen systems including better registration and alignment. This is particularly true for biomolecule technology such as protein and nucleic acid arrays.

SUMMARY

The present application through various embodiments provides a method which comprises: providing a two-dimensional array of a plurality of cantilevers, wherein the array comprises a plurality of base rows, each base row comprising a plurality of cantilevers extending from the base row, wherein each of the cantilevers comprises tips at the cantilever end away from the base row; wherein the two dimensional array has a support; providing a patterning composition, wherein the composition comprises a lipid; providing a substrate; coating the tips of the cantilevers with the patterning composition; and depositing at least some of the patterning composition from the tips to the substrate surface. In some embodiments, the lipids are phospholipid.

In some embodiments, the tips are coated by different patterning compositions simultaneously, wherein every second tip is coated by a different patterning composition, and the different patterning compositions are deposited onto the substrate in parallel simultaneously.

The present invention comprises a plurality of different embodiments.

For example, one embodiment comprises a two-dimensional array of a plurality of cantilevers, the cantilevers comprising tips at the cantilever ends, wherein the array is adapted to prevent substantial contact of non-tip components of the array when the tips are brought into contact with a substantially planar surface.

Another embodiment comprises an article comprising: (i) a two-dimensional array of a plurality of cantilevers, wherein the array comprises a plurality of base rows, each base row comprising a plurality of cantilevers extending from the base row, wherein each of the cantilevers comprise tips at the cantilever end away from the base row, wherein the array is adapted to prevent substantial contact of non-tip components of the array when the tips are brought into contact with a substantially planar surface; and (ii) a support for the array.

Another embodiment comprises an article comprising: (i) a two-dimensional array of a plurality of cantilevers, wherein the array comprises a plurality of base rows, each base row comprising a plurality of cantilevers extending from the base row, wherein each of the cantilevers comprise tips at the cantilever end away from the base row, wherein the array is adapted to prevent substantial contact of non-tip components of the array when the tips are brought into contact with a substantially planar surface.

In another embodiment, the invention provides an article comprising: a two-dimensional array of a plurality of cantilevers, wherein the array comprises a plurality of base rows, each base row comprising a plurality of cantilevers, wherein each of the cantilevers comprise tips at the cantilever end away from the base, and wherein the tips have an apex height relative to the cantilever of at least, for example, four microns, and a support for the array.

Another embodiment provides an article comprising: a two-dimensional array of a plurality of cantilevers, wherein the array comprises a plurality of base rows, each base row comprising a plurality of cantilevers, wherein each of the cantilevers comprise tips at the cantilever end away from the base, and wherein the tips are coated with metal on the tip side of the cantilever and the cantilevers are bent at an angle of at least, for example, 10° from their base.

In another embodiment, the invention provides, for example, a method of making an article, wherein the article comprises a two-dimensional array of a plurality of cantilevers, and a support for the array, the method comprising: (i) forming a two dimensional array comprising a plurality of cantilevers comprising tips at their ends, wherein the cantilevers are supported on a sacrificial support structure; (ii) forming an array support comprising a plurality of base rows which are adapted for bonding to the two dimensional array comprising a plurality of cantilevers; (iii) bonding the cantilevers to the base rows; and (iv) removing the support structure to release the cantilevers and form the array.

Still further, another embodiment is a method comprising (1) micromachining a two dimensional array of cantilevers wherein the cantilevers are adapted to bond with a device which both supports the cantilevers and can also couple the cantilevers to an instrument for motion, and (2) bonding the cantilevers to the device.

Also provided are instruments comprising the two dimensional arrays and support structures and methods of building and using the instruments, including for fabrication of micron-scale and nanometer scale structures.

Also provided are patterned substrates made from the arrays, devices, and instruments described herein.

Also provided are methods for fast patterning of nanostructures including, for example, at least 100,000 or at least 1,000,000 nanostructures per minute.

In a preferred embodiment, a solution is provided to the throughput limitation through the use of novel 55,000-pen two-dimensional arrays in the context of parallel DPN printing experiments for patterning, for example, gold substrates with sub-100 nm resolution over large, square centimeter areas.

This new approach to parallel scanning probe lithography over large areas can be contrasted with the work of others, which has focused on the production of linear and two-dimensional cantilever arrays with independent feedback systems, for the controlled oxidation (see, for example, Minne et al. *J. Vac. Sci. & Tech. B* 14, 2456-2461 (1996); Minne et al. *Appl. Phys. Lett.* 73, 1742-1744 (1998)) or melting of an underlying substrate (see, for example, Vettiger et al. *IEEE Trans. Nanotechnology* 1, 39-55 (2002)).

Notably, if feedback is not used, the lack of feedback systems coupled with the ability to pattern a surface with molecule-based inks can make this massively parallel DPN capability highly accessible and attractive for high throughput nanofabrication experiments and commercialization involving, for example, both soft organic and hard inorganic materials. It can be particularly useful, for example, for fabricating combinatorial libraries of structures and duplicates of a desired nanostructure or particular type of nanopatterned substrate.

DETAILED DESCRIPTION

Introduction/DPN Printing

Figure 1:
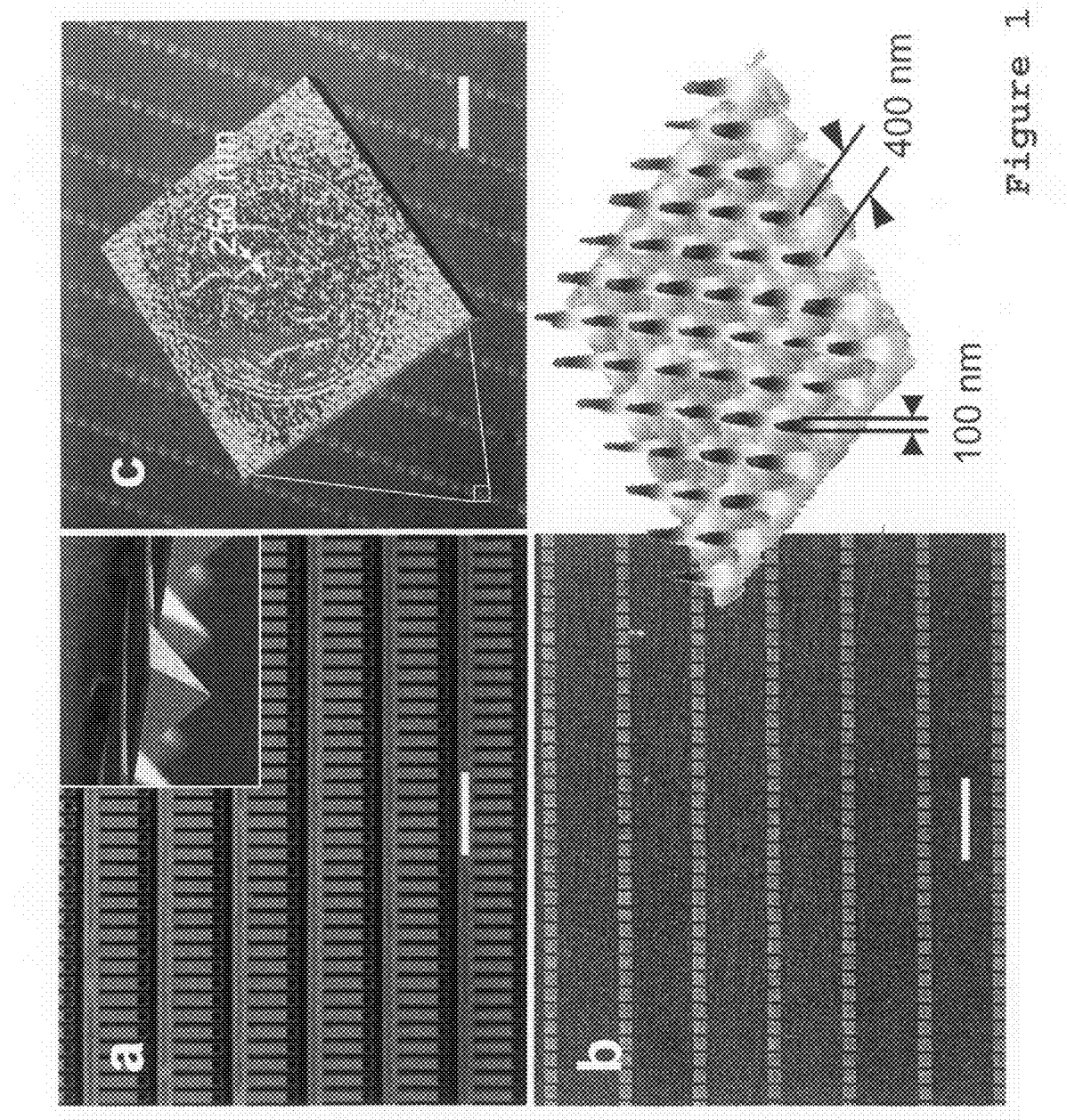
FIG. 1. DPN patterning with 55,000 AFM cantilevers in parallel: (a) Optical micrograph of part of the 2D array of cantilevers used for patterning. Inset shows an SEM image of the tips. (b) Large area SEM image (left) of part of an 88,000,000 gold dot array (40×40 within each block) on an oxidized silicon substrate. A representative AFM topographical image (right) of part of a block. (c) Representative optical micrograph (inset shows AFM image) of ~55,000 features drawn in the form of the face of the 2005 US five cent coins. The coin bears a picture of Thomas Jefferson, who helped develop the polygraph, a macroscopic letter duplicator that relies on an array of pens.

References will be made in detail to the preferred embodiments, examples of which are illustrated in the accompanying drawings. While the many facets of the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims and equivalents thereof.

Priority U.S. provisional application Ser. No. 60/792,950 filed Apr. 19, 2006 to Mirkin et al. is hereby incorporated by reference.

For practice of the various embodiments described herein, lithography, microlithography, and nanolithography instruments, pen arrays, active pens, passive pens, inks, patterning compounds, kits, ink delivery, software, and accessories for direct-write printing and patterning can be obtained from NanoInk, Inc., Chicago, Ill. Software includes INKCAD software (NanoInk, Chicago, Ill.), providing user interface for lithography design and control. E-Chamber can be used for environmental control. Dip Pen Nanolithography™ and DPN™ are trademarks of NanoInk, Inc.

The following patents and co-pending applications related to direct-write printing with use of cantilevers, tips, and patterning compounds are hereby incorporated by reference in their entirety and can be used in the practice of the various embodiments described herein, including inks, patterning compounds, software, ink delivery devices, and the like:

1. U.S. Pat. No. 6,635,311 to Mirkin et al., which describes fundamental aspects of DPN printing including inks, tips, substrates, and other instrumentation parameters and patterning methods;
2. U.S. Pat. No. 6,827,979 to Mirkin et al., which further describes fundamental aspects of DPN printing including software control, etching procedures, nanoplotters, and complex and combinatorial array formation.
3. U.S. patent publication number 2002/0122873 A1 published Sep. 5, 2002 ("Nanolithography Methods and Products Produced Therefor and Produced Thereby"), which describes aperture embodiments and driving force embodiments of DPN printing.
4. U.S. regular patent application Ser. No. 10/366,717 to Eby et al., filed Feb. 14, 2003 ("Methods and Apparatus for Aligning Patterns on a Substrate"), which describes alignment methods for DPN printing (published Oct. 2, 2003 as 2003/0185967).
5. U.S. regular patent application Ser. No. 10/375,060 to Dupeyrat et al., filed Feb. 28, 2003 ("Nanolithographic Calibration Methods"), which describes calibration methods for DPN printing.
6. U.S. Patent Publication 2003/0068446, published Apr. 10, 2003 to Mirkin et al. ("Protein and Peptide Nanoarrays"), which describes nanoarrays of proteins and peptides;
7. U.S. Regular patent application Ser. No. 10/307,515 filed Dec. 2, 2002 to Mirkin et al. ("Direct-Write Nanolithographic Deposition of Nucleic Acids from Nanoscopic Tips"), which describes nucleic acid patterning (PCT/US2002/038252 published Jun. 12, 2003).
8. U.S. Regular patent application Ser. No. 10/320,721 filed Dec. 17, 2002 to Mirkin et al. ("Patterning of Solid State Features by Direct-Write Nanolithographic Printing"), which describes reactive patterning and sol gel inks (now published Aug. 28, 2003 as 2003/0162004).
9. U.S. Pat. Nos. 6,642,129 and 6,867,443 to Liu et al. ("Parallel, Individually Addressible Probes for Nanolithography"), describing active pen arrays.
10. U.S. Patent Publication 2003/0007242, published Jan. 9, 2003 to Schwartz ("Enhanced Scanning Probe Microscope and Nanolithographic Methods Using Same").
11. U.S. Patent Publication 2003/0005755, published Jan. 9, 2003 to Schwartz ("Enhanced Scanning Probe Microscope").
12. U.S. patent application Ser. No. 10/637,641 filed Aug. 11, 2003, now published as 2004/0101469, describing catalyst nanostructures and carbon nanotube applications.
13. U.S. patent application Ser. No. 10/444,061 filed May 23, 2003, now published as 2004/0026681 published Feb. 12, 2004, and US patent publication 2004/0008330 published Jan. 15, 2004, describing printing of proteins and conducting polymers respectively.
14. U.S. patent application Ser. No. 10/647,430 filed Aug. 26, 2003, now U.S. Pat. No. 7,005,378, describing conductive materials as patterning compounds.
15. U.S. patent application Ser. No. 10/689,547 filed Oct. 21, 2003, now published as 2004/0175631 on Sep. 9, 2004, describing mask applications including photomask repair.
16. U.S. patent application Ser. No. 10/705,776 filed Nov. 12, 2003, now published as 2005/0035983 on Feb. 17, 2005, describing microfluidics and ink delivery.
17. U.S. patent application Ser. No. 10/788,414 filed Mar. 1, 2004, now published as 2005/0009206 on Jan. 13, 2005 describing printing of peptides and proteins.
18. U.S. patent application Ser. No. 10/893,543 filed Jul. 19, 2004, now published as 2005/0272885 on Dec. 8, 2005, describing ROMP methods and combinatorial arrays.
19. U.S. patent application Ser. No. 11/056,391 filed Feb. 14, 2005, now published as 2005/0255237 published on Nov. 17, 2005, describing stamp tip or polymer coated tip applications.
20. U.S. patent application Ser. No. 11/065,694 filed Feb. 25, 2005, now published as 2005/0235869 on Oct. 27, 2005, describing tipless cantilevers and flat panel display applications.
21. US Patent publication 2006/001,4001 published Jan. 19, 2006 describing etching of nanostructures made by DPN methods.
22. WO 2004/105046 to Liu & Mirkin published Dec. 2, 2004 describes scanning probes for contact printing.
23. U.S. Provisional Application 60/929,314 filed on Jun. 21, 2007 describes patterning with compositions comprising lipid.

All references cited in 1-23 above are incorporated by reference in their entirety including descriptions, figures, and claims, and the teachings therein can be adapted for use with the various embodiments described herein.

DPN methods are also described in Ginger et al., "The Evolution of Dip-Pen Nanolithography," *Angew. Chem. Int. Ed.* 2004, 43, 30-45, including description of high-throughput parallel methods.

Direct write methods, including DPN printing and pattern transfer methods, are described in for example *Direct-Write Technologies, Sensors, Electronics, and Integrated Power Sources*, Pique and Chrisey (Eds), 2002.

The direct-write nanolithography instruments and methods described herein are particularly of interest for use in preparing bioarrays, nanoarrays, and microarrays based on peptides, proteins, nucleic acids, DNA, RNA, viruses, biomolecules, and the like. See, for example, U.S. Pat. No. 6,787,313 for mass fabrication of chips and libraries; U.S. Pat. No. 5,443,791 for automated molecular biology laboratory with pipette tips; U.S. Pat. No. 5,981,733 for apparatus for the automated synthesis of molecular arrays in pharmaceutical applications. Combinatorial arrays can be prepared. See also, for example, U.S. Pat. Nos. 7,008,769; 6,573,369; and 6,998,228 to Henderson et al.

Scanning probe microscopy is reviewed in Bottomley, *Anal. Chem.*, 1998, 70, 425R-475R. Also, scanning probe microscopes are known in the art including probe exchange mechanisms as described in, for example, U.S. Pat. No. 5,705,814 (Digital Instruments).

Two Dimensional Arrays

One embodiment is an article comprising: (i) a two-dimensional array of a plurality of cantilevers, wherein the array comprises a plurality of base rows, each base row comprising a plurality of cantilevers extending from the base row, wherein each of the cantilevers comprise tips at the cantilever end away from the base row, wherein the arrays are adapted to prevent substantial contact of non-tip components of the array when the tips are brought into contact with a substantially planar surface; and (ii) a support for the array. One particular embodiment is illustrated in the non-limiting working examples and figures.

One embodiment also provides an article comprising: (i) a two-dimensional array of a plurality of cantilevers, wherein the array comprises a plurality of base rows, each base row comprising a plurality of cantilevers, wherein each of the cantilevers comprise tips at the cantilever end away from the base, wherein the number of cantilevers is greater than 250, and wherein the tips have an apex height relative to the cantilever of at least, for example, four microns, and (ii) a support for the array. One particular embodiment is illustrated in the non-limiting working examples and figures.

Another embodiment provides an article comprising: a two-dimensional array of a plurality of cantilevers, wherein the array comprises a plurality of base rows, each base row comprising a plurality of cantilevers, wherein each of the cantilevers comprise tips at the cantilever end away from the base, wherein the number of cantilevers is greater than 250, and wherein the tips are coated with metal on the tip side of the cantilever and the cantilevers are bent at an angle of, for example, at least 10° from their base. One particular embodiment is illustrated in the non-limiting working examples and figures.

Two-dimensional arrays of cantilevers are known in the art. For example, the two-dimensional array can be a series of rows and columns, providing length and width, preferably substantially perpendicular to each other. The arrays can comprise a first dimension and a second dimension. The two-dimensional array can be a series of one dimensional arrays disposed next to each other to build the second dimension. The two dimensions can be perpendicular. The cantilevers can comprise a free end and a bound end. The cantilevers can comprise tips at or near the free end, distal from the bound end. The cantilevers of one row can point in the same direction as the cantilevers on the next row, or the cantilevers of one row can point in the opposite direction as the cantilevers on the next row.

The two-dimensional arrays can be fabricated by combining two parts, each part having a surface which is patterned in two dimensions and adapted to be mated with each other in the two dimensions.

One important variable is the fraction or percentage of the cantilevers in the array which can actually function for the intended purposes. In some cases, some cantilevers can be imperfectly formed, or can be otherwise damaged after formation. A cantilever yield reflects this percentage of usable cantilevers. Preferably, the array is characterized by a cantilever yield of at least 75%, or at least 80%, or at least 90%, or at least 95%, or more preferably, at least about 98%, or more preferably at least 99%. In characterizing the cantilever yield, cantilevers at the ends of rows may be neglected which are damaged by processing of edges compared to internal cantilevers. For example, the central 75% can be measured. In many cases, the fabrication will be better done in the middle rather than the edge as edge effects are known in wafer fabrication. Defect density can increase in some cases as one moves from the center to the edge.

The array can be adapted to prevent substantial contact of non-tip components of the array when the tips are brought into contact with a substantially planar surface. For example, the cantilever arms should not contact the surface and can be accordingly adapted such as by, for example, bending. The tips can be adapted for this as well including, for example, long tips. Factors which can be useful to achieve this result include use of long tips, bending of the cantilever arms, tip leveling, row leveling, and leveling of the cantilevers in all dimensions. One or more combination of factors can be used.

The cantilever tips can be longer than usual in the art. For example, the tips can have an apex height relative to the cantilever of at least four microns on average, and if desired, the tips can have an apex height relative to the cantilever of at least seven microns on average. In addition, tip apex height can be at least 10 microns, or at least 15 microns, or at least 20 microns. No particular upper limit exists and technology known in the art and improving can be used. This long length can help ensure that only tips are contacting the surface. Apex height can be taken as an average of many tip apex heights, and in general, apex height is engineered not to vary substantially from tip to tip. Methods known in the art can be used to measure tip apex height including methods shown in the working examples.

In measuring parameters for the array, average measurements can be used. Average measurements can be obtained by methods known in the art including for example review of representative images or micrographs. The entire array does not need to be measured as that can be impractical.

Tipless cantilevers can be used in some embodiments, although not a preferred embodiment. For example, one embodiment provides an article comprising: (i) a two-dimensional array of a plurality of cantilevers, wherein the array comprises a plurality of base rows, each base row comprising a plurality of cantilevers extending from the base row, wherein each of the cantilevers are tipless cantilevers, wherein the cantilevers are bent at an angle from their base.

In addition, the cantilevers can be bent including bent towards the surface to be patterned. Methods known in the art can be used to induce bending. The cantilevers can be bent at an angle away from the base and the support. The cantilevers can comprise multiple layers adapted for bending of cantilevers. For example, differential thermal expansion or cantilever bimorph can be used to bend the cantilevers. Cantilever bending can be induced by using at least two different materials. Alternatively, the same materials can be used but with different stresses to provide cantilever bending. Another method is depositing on the cantilever comprising one material a second layer of the same material but with an intrinsic stress gradient. Alternatively, the surface of the cantilever can be oxidized. The cantilevers can be bent at an angle for example of at least 5° from their base, or at least 10° from their base, or at an angle of at least 15° from their base. Methods known in the art can be used to measure this including the methods demonstrated in the working examples. Average value for angle can be used. The cantilevers can be bent on average about 10 microns to about 50 microns, or about 15 microns to about 40 microns. This distance of bending can be measured by methods known in the art including the methods demonstrated in the working examples. Average distance can be used. The bending can result in greater tolerance to substrate roughness and morphology and tip misalignment within the array so that for example a misalignment of about ±20 microns or less or about ±10 microns or less can be compensated.

To facilitate bending, the cantilevers can comprise multiple layers such as two principle layers and optional adhesion layers and can be for example bimorph cantilevers. The cantilevers can be coated with metal or metal oxide on the tip side of the cantilever. The metal is not particularly limited as long as the metal or metal oxide is useful in helping to bend the cantilevers with heat. For example, the metal can be a noble metal such as gold.

In preferred embodiments, the array can be adapted so that the cantilevers are both bent toward the surface and also comprise tips which are longer than normal compared to tips used merely for imaging.

The tips can be fabricated and sharpened before use and can have an average radius of curvature of, for example, less than 100 nm. The average radius of curvature can be, for example, 10 nm to 100 nm, or 20 nm to 100 nm, or 30 nm to 90 nm. The shape of the tip can be varied including for example pyramidal, conical, wedge, and boxed. The tips can be hollow tips or contain an aperture including hollow tips and aperture tips formed through microfabrication with microfluidic channels passing to end of tip. Fluid materials can be stored at the end of the tips or flow through the tips.

The tip geometry can be varied and can be for example a solid tip or a hollow tip. WO 2005/115630 (PCT/US2005/014899) to Henderson et al. describes tip geometries for depositing materials onto surfaces which can be used herein.

The two dimensional array can be characterized by a tip spacing in each of the two dimensions (e.g., length dimension and width dimension). Tip spacing can be taken, for example, from the method of manufacturing the tip arrays or directly observed from the manufactured array. Tip spacing can be engineered to provide high density of tips and cantilevers. For example, tip density can be at least 10,000 per square inch, or at least 40,000 per square inch, or at least 70,000 per square inch. The array can be characterized by a tip spacing of less than 300 microns in a first dimension of the two dimensional array and less than 300 microns in a second dimension of the two dimensional array. To achieve even higher density, the tip spacing can be, for example, less than about 200 microns in one dimension and less than about 100 microns, or less than about 50 microns, in another dimension. Alternatively, the tip spacing can be for example less than 100 microns in one dimension and a less than 25 microns in a second direction. The array can be characterized by a tip spacing of 100 microns or less in at least one dimension of the two dimensional array. In one embodiment, tip spacing can be about 70 microns to about 110 microns in one dimension, and about 5 microns to about 35 microns in the second dimension. There is no particular lower limit on tip spacing as fabrication methods will allow more dense tip spacing over time. Examples of lower limits include 1 micron, or 5 microns, or 10 microns so for example tip spacings can be one micron to 300 microns, or one micron to 100 micron.

The number of cantilevers on the two dimensional array is not particularly limited but can be at least about three, at least about five, at least about 250, or at least about 1,000, or at least about 10,000, or at least about 50,000, or at least about 55,000, or at least about 100,000, or about 25,000 to about 75,000. The number can be increased to the amount allowed for a particular instrument and space constraints for patterning. A suitable balance can be achieved for a particular application weighing for example factors such as ease of fabrication, quality, and the particular density needs.

The tips can be engineered to have consistent spacing for touch the surface consistently. For example, each of the tips can be characterized by a distance D spanning the tip end to the support, and the tip array is characterized by an average distance D' of the tip end to the support, and for at least 90% of the tips, D is within 50 microns of D'. In another embodiment, for at least 90% of the tips, D is within 10 microns of D'. The distance between the tip ends and the support can be for example about 10 microns to about 50 microns. This distance can comprise for example the additive combination of base row height, the distance of bending, and the tip height.

Base row length is not particularly limited. For example, the base rows can have an average length of at least about 1 mm. Average length for base row can be, for example, about 0.1 mm to about 30 mm, or about 0.1 mm to about 15 mm, or about 0.1 mm to about 5 mm, or about 0.5 mm to about 3 mm.

The base rows can have a height with respect to the support of at least about 5 microns. This height is not particularly limited but can be adapted for use with the appropriate cantilever bending.

Cantilever force constant is not particularly limited. For example, the cantilevers can have an average force constant of about 0.001 N/m to about 10 N/m, or alternatively, an average force constant of about 0.05 N/m to about 1 N/m, or alternatively an average force constant of about 0.1 N/m to about 1 N/m, or about 0.1 N/m to about 0.6 N/m.

A variety of methods can be used for bonding the cantilevers to the base, and the methods are not particularly limited. Bonding methods are described for example in Madou, *Fundamentals of Microfabrication,* $2^{nd}$ Ed., pages 484-494 which describes for example field-assisted thermal bonding, also known as anodic bonding, electrostatic bonding, or the Mallory process. Methods which provide low processing temperature can be used. For example, the cantilevers can be bound to the base by a non-adhesive bonding. Bonding examples include electrostatic bonding, field-assisted thermal bonding, silicon fusion bonding, thermal bonding with intermediate layers, eutectic bonding, gold diffusion bonding, gold thermocompression bonding, adhesive bonding, and glass frit bonding.

The cantilevers can be engineered so they are not adapted for feedback including force feedback. Alternatively, at least one cantilever can be adapted for feedback including force feedback. Or substantially all of the cantilevers can be adapted for feedback including force feedback. For example, over 90%, or over 95%, or over 99% of the cantilevers can be adapted for feedback including force feedback.

The cantilevers can be bound to the base by electrostatic binding.

The cantilevers can be made from materials used in AFM probes including for example silicon, polycrystalline silicon, silicon nitride, or silicon rich nitride. The cantilevers can have a length, width, and height or thickness. The length can be for example about 10 microns to about 80 microns, or about 25 microns to about 65 microns. The width can be for example 5 microns to about 25 microns, or about 10 microns to about 20 microns. Thickness can be for example 100 nm to about 700 nm, or about 250 nm to about 550 nm. Tipless cantilevers can be used in the arrays, the methods of making arrays, and the methods of using arrays.

The cantilevers can be supported on the base rows, and the base rows in turn can be supported on a larger support for the array. The base rows can extend from the larger support for the array. The array support can be characterized by a surface area which is about two square cm or less, or alternatively about 0.5 square cm to about 1.5 square cm. The size can be adjusted as needed for coupling with an instrument.

Arrays can be adapted for passive pen or active pen use. Control of each tip can be carried out by piezoelectric, capacitive, or thermoelectric actuation, for example.

The arrays can be adapted for integration of tip coating and ink delivery. For example, microfluidics can be used to control inking and coating of the tips. Tips can be dipped into devices or ink can be delivered directly through internal regions of the tip for hollow tip embodiments.

The tips can be coated with a patterning compound or ink material. The coating is not particularly limited; the patterning compound or ink material can be disposed at the tip end. Patterning compounds and materials are known in the art of nanolithographic printing and include organic compounds and inorganic materials, chemicals, biological materials, non-reactive materials and reactive materials, molecular compounds and particles, nanoparticles, materials that form self assembled monolayers, soluble compounds, polymers, ceramics, metals, magnetic materials, metal oxides, main group elements, mixtures of compounds and materials, conducting polymers, biomolecules including nucleic acid materials, RNA, DNA, PNA, proteins and peptides, antibodies, enzymes, lipids, carbohydrates, and even organisms such as viruses. The references described in the INTRODUCTION section describe many patterning compounds which can be used. Sulfur-containing compounds including thiols and sulfides can be used.

The methods by which the tips can be coated can include for example solution dipping or vacuum evaporation, as well as the microfluidic methods noted above. See U.S. patent application Ser. No. 10/705,776 filed Nov. 12, 2003, now published as 2005/0035983 on Feb. 17, 2005.

Methods of Making Two Dimensional Arrays

Figure 2:
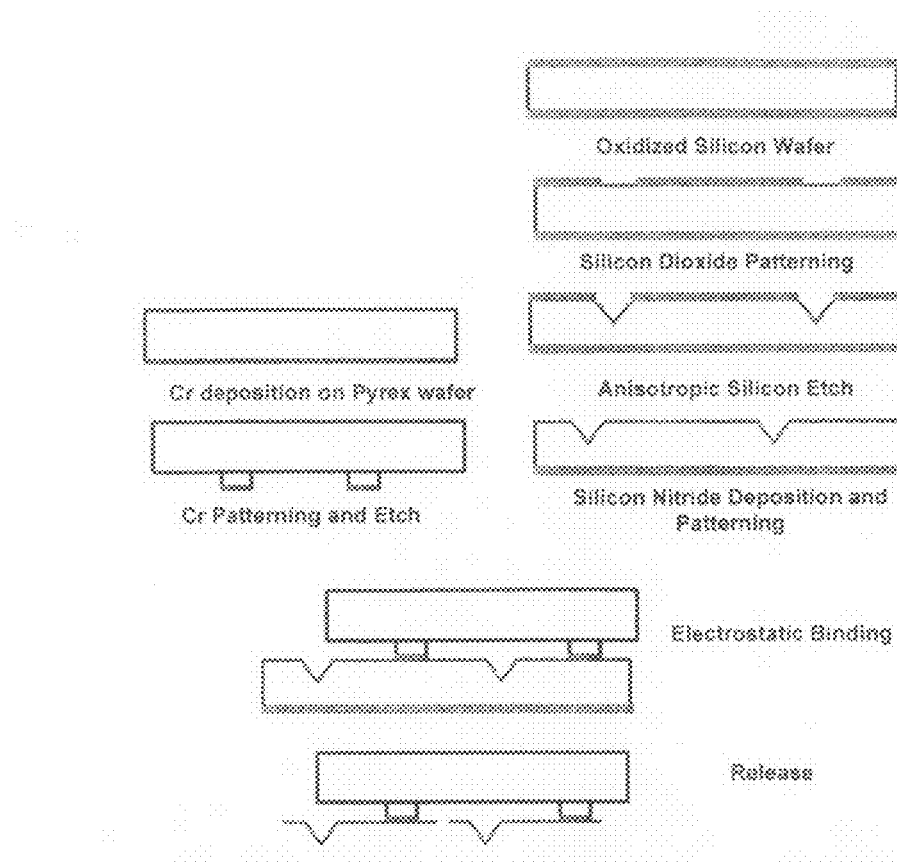
FIG. 2. A schematic diagram of the fabrication process for 2D cantilever arrays.

Another embodiment comprises a method of making two dimensional arrays. For example, an embodiment comprises a method of making article, wherein the article comprises a two-dimensional array of a plurality of cantilevers, and a support for the array, the method comprising: (i) forming a two dimensional array comprising a plurality of cantilevers comprising tips at their ends, wherein the cantilevers are supported on a sacrificial support structure; (ii) forming an array support comprising a plurality of base rows which are adapted for bonding to the two dimensional array comprising a plurality of cantilevers; (iii) bonding the cantilevers to the base rows; and (iv) removing the support structure to release the cantilevers and form the array. The non-limiting working examples below provide one method for executing these steps. See FIG. 2. In FIG. 2, the structure shown as "electrostatic binding" comprises patterned cantilevers (patterning not shown).

In some embodiments, tipless cantilevers can be fabricated.

The above description for the article comprising the two dimensional arrays and support can be also applied to the methods making the two dimensional arrays. For example, in the method of making, the tips can be adapted to prevent substantial contact of non-tip components of the array when the tips are brought into contact with a substantially planar surface. In the method of making, the tips can have an apex height relative to the cantilever of at least four microns, or at least seven microns. In the method of making, the method can further comprise the step of bending the cantilevers at an angle away from the support. For example, the method can comprise bending the cantilevers at an angle of at least 100 away from the support. In the method of making, the tips can have an apex height relative to the cantilever of at least four microns, and wherein the cantilevers are bent at an angle away from the support. Also, in the method of making, the tips can have an apex height relative to the cantilever of at least seven microns, and wherein the cantilevers are bent at an angle of at least 10° away from the support.

Microfabrication methods are described extensively in for example Madou, *Fundamentals of Microfabrication*, 2$^{nd}$ Ed., CRC Press, 2002; and Van Zant, *Microchip Fabrication*, 5$^{th}$ Ed., 2004.

In one part of the fabrication method, the two dimensional array can be formed by microfabrication and micromachining methods. The sub-product can comprise the cantilevers supported on a sacrificial support which can be later removed before use. Microfabrication steps including wafers, oxidation, patterning, etching, deposition, deep reactive ion etching (Bosch process) and other steps known for making cantilevers and tips can be used.

In another part of the fabrication method, an array support is formed which is adapted for bonding to the two dimensional array of cantilevers. It can be also adapted for coupling the two dimensional array of cantilevers to the instrument for movement. Base rows can be formed which extend out from the surface of the array support and provide support for the cantilevers upon fabrication.

The cantilevers can be bonded to the base rows. An example of a bonding method is electrostatic bonding.

The sacrificial support for the cantilevers can be removed to free up or release the cantilevers. Methods known in the art can be used to execute this step.

FIG. 2 from the working examples below illustrates a fabrication method, although the parameters and materials described therein can be modified. For example, the 200 nm layer of silicon oxide can be, for example, 100 nm to 300 nm; the 950° C. can be for example 850° C. to 1050° C.; the 30 minutes can be for example 15 minutes to 45 minutes; the 10 micron square openings do not have to be square can be for example 5 microns to 15 microns; the 400 nm silicon nitride layer can be 200 nm to 600 nm, or 300 nm to 500 nm; the 200 nm thick chromium layer can be for example 100 nm to 300 nm; the 100 micron trenches can be for example 50 microns to about 150 microns; the eight micron recesses can be for example 3 microns to 13 microns so as to allow cantilever free movement; and the like.

The working examples also provide a method for annealing pen arrays and the parameters described therein can be modified. For example, the 5 nm Ti adhesion layer can be 2 nm to 20 nm thick, and the 25 nm gold layer can be 5 nm to 100 nm thick. The annealing temperature can be for example 150° C. to about 500° C., and the time for annealing can be for example 30 minutes to 250 minutes.

Also provided is a method comprising (1) micromachining a two dimensional array of cantilevers wherein the cantilevers are adapted to bond with a device which both supports the cantilevers and can also couple the cantilevers to an instrument for motion, and (2) bonding the cantilevers to the device. The device can be called a handle wafer. One side is for bonding to the cantilevers. The other side is for coupling to a larger instrument. The working examples below, for example, also illustrate this embodiment.

Leveling

Level can be carried out to provide leveling in each dimension of the two dimensional array. Leveling can help with adapting the array so only tips contact the surface. The working examples below provide an example of leveling the cantilevers before the two dimensional array of cantilevers are mounted onto an instrument. For example, gravity forces and forces near to gravity forces can be used to level the cantilevers on a sacrificial substrate. External force can be used. Other forces can be used as needed for a particular two dimensional array. For example, forces can be about 0.2 nN/tip to about 2,000 nN/tip, or about 2 nN/tip or about 200 nN/tip, or about 20 nN/tip. The sacrificial substrate can be made as flat as possible and practical for a given application.

The adhesive mounting method also allows one to improve leveling and avoid use of a feedback system if desired.

Optical microscopy can be used to facilitate leveling.

One embodiment provides a method comprising: (i) preparing a two-dimensional array of a plurality of cantilevers, wherein the array comprises a plurality of base rows, each base row comprising a plurality of cantilevers extending from the base row, wherein each of the cantilevers comprise tips at the cantilever end away from the base row, (ii) contacting tips of the array with a sacrificial substrate under pressure, (iii) forming an aligned array on the substrate, and (iv) attaching the aligned array to an instrument adapted for motion of the array. The pressure can be generated either externally or with gravity. The attaching can be an adhesive or mechanical attaching. The method can further comprise removing the sacrificial substrate from the tips of the array.

Mounting the Supported Two Dimensional Arrays on an Instrument

Mounting of arrays to the instrument can be achieved by one or more mechanisms operating individually or in combination. For example, mounting can be carried out with use of mechanical coupling, friction fit or magnetic coupling. Adhesives and glues can be used including fast curing and UV curing systems. Epoxy glue is described below including its use as a gap filler or space filler.

Adhesive mounting can be used to couple the supported two dimensional arrays to an instrument which provides x motion, y motion, z motion, or combinations thereof including x, y, z motion. Motion is provided which allows for high resolution patterning and high resolution such as found with for example scanning probe instruments.

The instrumentation can be also adapted to have the pens stand still and have the substrates move in x, y, and/or z motion.

In a preferred embodiment, the bonding agent functions to both mount the two dimensional array to the instrument and also the facilitate leveling of the tip array.

Instrument

Also provided are instruments including printing and patterning instruments, as well as nanolithography instruments. Instruments can be used which provide both imaging and patterning capability. While the methods and devices herein can be used with scanning probe and AFM instrumentation, the instruments are not so limited. Dispensing instruments and tools for delivering small scale amounts of materials to surfaces are known. See for example U.S. Pat. Nos. 6,024, 925; 6,087,274; 5,981,733;

A preferred example of an instrument for lithography including microlithography and nanolithography is the NScriptor™ from NanoInk (Chicago, Ill.). Commercial AFM instruments can be used.

An instrument is described in U.S. Pat. No. 7,008,769 to Henderson et al.

Using the Two Dimensional Arrays

DPN patterning is describe in the references noted above in the Introduction Section and other references cited herein.

Substrates can be made with massive numbers of micron-scale or nanometer-scale structures, or nanostructures, formed at massively fast rates. For example, one important parameter is the rate at which structures can be formed. Using methods described herein, structures can be formed at a rate of at least 100,000 per minute, or at least 1,000,000 structures per minute, and even further at least 2,000,000 structures per minute, and even further at least 3,000,000 structures per minute, and even further at least 4,000,000 structures per minute, and even further at least 5,000,000 structures per minute, and even further at least 10,000,000 structures per minute. For example, structures formed at fast rates can be dot features having a diameter of for example about 25 nm to about 500 nm, or about 50 nm to about 200 nm. The structures can be dots and circles, wherein the tip is not moved in the X-Y direction during deposition of the patterning compound.

Other rate parameters can be used. For example, direct-writing can be carried out at a rate of at least 1.0 meter/min, or at least 3.3 meters/min (for example, if the tips are moved at appropriate rates such as for example a rate of 1 um/s). Patterning can be executed at 10,000,000 square microns per hour. Rates can be in some cases determined by the rate of diffusion spreading for one pen with multiplication by the number of pens.

A preferred embodiment comprises a method for direct-write nanolithography comprising: directly writing nanostructures at a rate of at least 100,000 per minute, wherein the directly writing comprises contacting a tip having a patterning compound thereon with a substrate. The rate can be at least 1,000,000 per minute, or at least 4,000,000 per minute. The nanostructures can comprise dots, lines, or substantially complete circles. The nanostructures can comprise dots having diameter about 50 nm to about 1,000 nm. The nanostructures can be separated by a distance between about 50 nm and about 1,000 nm, or about 100 nm to about 750 nm.

Substrates can be coated and patterned with for example at least 25,000,000 structures, or at least 50,000,000 structures, or at least 75,000,000 structures, or at least 1,000,000 structures, or at least 500,000,000 million structures, or at least 1,000,000,000 structures.

An important aspect is that the pattern formed on the substrate substantially matches either (1) a pattern generated with software and made with tip motion, or (2) the pattern of the array when the tips are not moved over the surface.

An important embodiment comprises the elimination of a feedback system. This embodiment, having this eliminated, is a basic and novel feature.

The substrates for patterning can be single layer or multilayer. They can be solids including polymers, glasses, composites, silicon, mica, diamond, ceramics, metals, and various oxides and complex mixtures.

The ink-substrate combination can be selected to provide stable structures. Stability can be enhanced by use of covalent bonding or chemisorption, or electrostatic attraction.

Arrays can be formed of inorganic, organic, or biological materials including nanostructures such as viruses, proteins, carbon nanotubes, nanowires, dendrimers, fullerenes, and the like. Combinatorial arrays can be formed. Each spot in the array can provide the same composition or a different composition compared to the next spot.

Vibration isolation tables can be used. Environmental chambers can be used including nebulizer, real-time sensors for temperature and humidity control, and heating and cooling fans. High resolution optics can be used. Independent three motor leveling can be used. Tip biasing can be used.

If AFM-like instrumentation is used, the mode can be contact mode, non-contact mode, or intermittent contact mode.

Patterning Lipid

Another example of a use can be found in Lenhert et al, "Massively Parallel Dip-Pen Nanolithography of Heterogeneous Supported Phospholipid Multilayer Patterns," Small, 2007, 3, No. 1, 71-75, which is hereby incorporated by reference including FIGS. 1-4, experimental section, and noting references cited therein. The instruments described herein can be used to control multi-bilayer stacking (FIG. 1); phospholipid patterns including fluorophore doping (FIG. 2); parallel writing of multiple inks including for testing membrane fluidity; and generation of fluorescent micrographs.

Phospholipids are an essential component of biological membranes, as their lyotropic liquid-crystalline nature enables them to self-assemble into two-dimensional bilayer sheets under physiological conditions (1). Micro- and nanoscopic heterogeneities, such as lipid rafts (2,3) and focal adhesions (4,5), are vital to the biological function of lipid bilayer membranes. Lithographically patterned phospholipid membranes can be used as cell-surface models (6) and have been used in several applications, including biochemical sensors (7), drug screening and delivery (8,9), the analysis of cell-cell interactions (3,10), and to address fundamental biological questions in membrane trafficking (11). However, in order to create model systems that are capable of mimicking the structural complexity of biological membranes, a method is necessary that allows both high-resolution patterning and parallel deposition of different phospholipid materials over large areas. In one embodiment it is provided a method of lithography suitable for the rapid fabrication and integration of large-scale phospholipid nanostructure libraries on a variety of substrates. This method provides in one embodiment a lateral resolution down to 100 nm and an areal throughput of 5 $cm^2$ $min^{-1}$.

Previously, micropatterned lipid bilayers on solid supports have been prepared using several approaches. For example, a microarrayer that deposits nanoliter droplets of phospholipid solutions can be used to create arrays of supported lipid bilayers which are physiologically fluid and can thus be applied to mimic the behavior of natural biomembranes (9). Microcontact printing and related soft lithographic techniques have also been used to create arrays of supported lipid bilayers. This technique was used to investigate the binding of a protein (annexin V) and an anti-inflammatory drug (nimesulide) with supported lipid bilayers (12). Diffusion barriers within a single bilayer can be created by patterning the substrate underlying a supported lipid bilayer using photolithography (13). When this technique is combined with the high lateral resolution of scanning-probe lithography, two lipids of different composition can be integrated by a nano-grafting method to achieve pixel sizes of 1 μm, although only in a serial process (14).

Microdomains can play important roles in the in vivo function of biological membranes. For instance, protein clustering on a length scale of 5-200 nm takes place within the focal adhesions that govern cell-surface interactions and motility (5). The exact size of lipid domains in biological membranes, collectively referred to as lipid rafts, is still a matter of debate, although most agree that they are sub-micrometer in size) (2). A method that allows both high-resolution patterning and parallel integration of different phospholipid materials is lacking, yet necessary for the fabrication of model systems that are capable of mimicking these complex biological membrane patterns.

DPN printing makes use of, in one embodiment, an atomic force microscope tip to directly deposit molecular inks onto a surface, reproducibly allowing line widths below 20 nm in the case of alkanethiols on gold (15, 16). The ability for DPN to operate under ambient conditions makes it particularly well suited to the fabrication of biomolecular arrays. This unique capability has been demonstrated by the fabrication of DNA and protein arrays with sub-100-nm lateral resolution (17, 18). The fabrication of small spot sizes locally concentrates the analyte, which enables the detection of very low bulk analyte concentrations (19). Importantly, DPN has an advantage over other types of lithography in that many different chemical functionalities can be integrated onto a single surface (16) without the risk of feature cross-contamination, as in the previously used indirect methods (14). Since the line widths and spot sizes in DPN are independent of the contact force of the microscope tip on the substrate, the technique can be readily carried out in parallel with arrays of cantilevers over centimeter length scales (20, 21).

Figure 15:
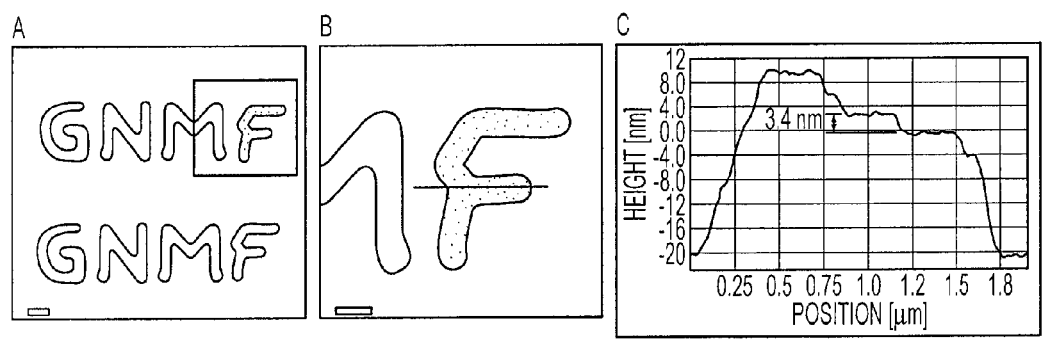
FIG. 15. AFM topographical measurements showing a bilayer thickness of 3.4±0.2 nm. A) An overview of the pattern. B) A higher magnification of the area outlined in a revealing the presence of discrete steps in the patterned film. C) A line scan showing the topography of the line drawn in b as a function of position. A 3.4 nm step is shown. Scale bars: 500 nm.

Lipids can be patterned, and in particular, it is found that the phospholipid 1,2-dioleoyl-sn-glycero-3-phosphocholine (DOPC, Tm=−16.5° C.) is a suitable ink for DPN under humidity-controlled conditions (22). The phase behavior of this compound is well characterized as it is a standard model system for unsaturated lipid bilayer membranes (23). At room temperature and the humidity range used in this work (40-95%), the compound is in the lamellar liquid-crystalline ($L_\alpha$) phase (24,25). The head-to-head spacing for a single bilayer of DOPC in the $L_\alpha$ phase has been measured to be 3.53 nm by X-ray diffraction (26), and temperature-controlled atomic force microscopy (AFM) of phospholipid bilayers in this phase shows 3.4-3.6-nm steps (27). Consistent with those measurements, we observe step heights of (3.4±0.2) nm in AFM topographical images of the DPN patterns (see FIG. 15). The humidity is a critical parameter in both the coating of the tips and the DPN writing of DOPC. An atomic force microscope tip can be reproducibly coated with DOPC at room temperature by placing the tip in contact with the pure material while it is sufficiently hydrated. Under ambient humidity, the ink may not flow onto the tip. However, at a higher humidity, the phospholipid ink may become sufficiently fluid and may readily coat or be otherwise disposed on the tip.

While most ink-substrate combinations used for DPN make use of covalent binding or chemisorption between the ink and the substrate, this approach is undesirable for the patterning of biomimetic phospholipid membranes, because covalent links or strong chemisorption between the lipids and the surface prevent lateral mobility within the lipid bilayers (6,28). Owing to the amphiphilic nature of the phospholipids, it is possible to use physisorption as a driving force for the ink transport from the tip to the surface. Various embodiments reproducibly generate DOPC patterns on silicon wafers, glass slides (either untreated or made hydrophilic by treatment with oxygen plasma), evaporated metal films, and hydrophobic polystyrene cut from petri dishes.

Figure 11:
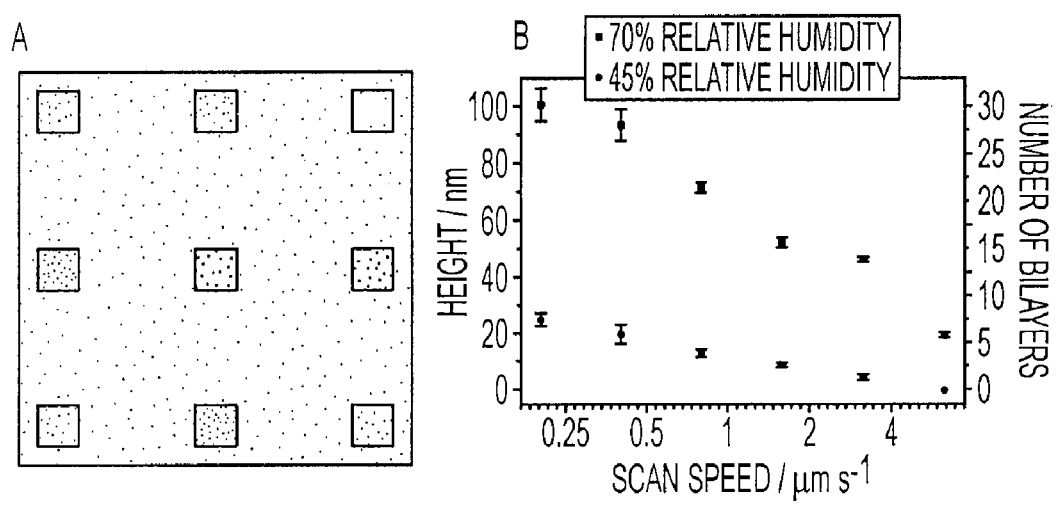
FIG. 11. Control of multi-bilayer stacking. A) Reflection-mode optical micrograph of phospholipid squares patterned on plasma-oxidized silicon at various speeds; scale bar: 5 μm. B) The height of phospholipid multilayers (and the corresponding number of bilayer stacks) measured by AFM is plotted as a function of scan speed (on a logarithmic scale) at two different relative humidities. Error bars represent the standard deviation between the heights of eight different cross sections of a single square.

Rather than spreading laterally over the surface to form a monolayer like covalent DPN inks, the phospholipid ink tends to stack three dimensionally on the surface. However, when left at high humidity for extended periods of time (e.g., 90% for 1 hour), the multilayer stacks will slowly spread on hydrophilic or hydrophobic surfaces to form a thin, homogeneous layer (data not shown). This may be attributed to stacking effect to the slow spreading kinetics of the phospholipids in air. The heights of the DOPC features measured by AFM exhibit a strong correlation with the tip velocity and the relative humidity (FIG. 11). A reflection-mode micrograph of DOPC films deposited from an atomic force microscope tip onto plasma-oxidized silicon by scanning 5-μm areas at various speeds exhibits different colors for each deposited square, a consequence of optical interference due to different film thicknesses (FIG. 11A). AFM measurements show a linear dependence of the film thickness on the logarithm of the tip velocity (FIG. 11B). This trend is analogous to the lateral diffusion observed in conventional covalent DPN (29). The relative humidity can play an important role, both in the inking of the tip and in the multilayer stacking during writing. While not limited by theory, it is therefore likely that both the hydration-dependent phase behavior of the phospholipid ink (24) and the water meniscus condensed between the microscope tip and the substrate (30-32) govern transport of the phospholipid ink.

Figure 12:
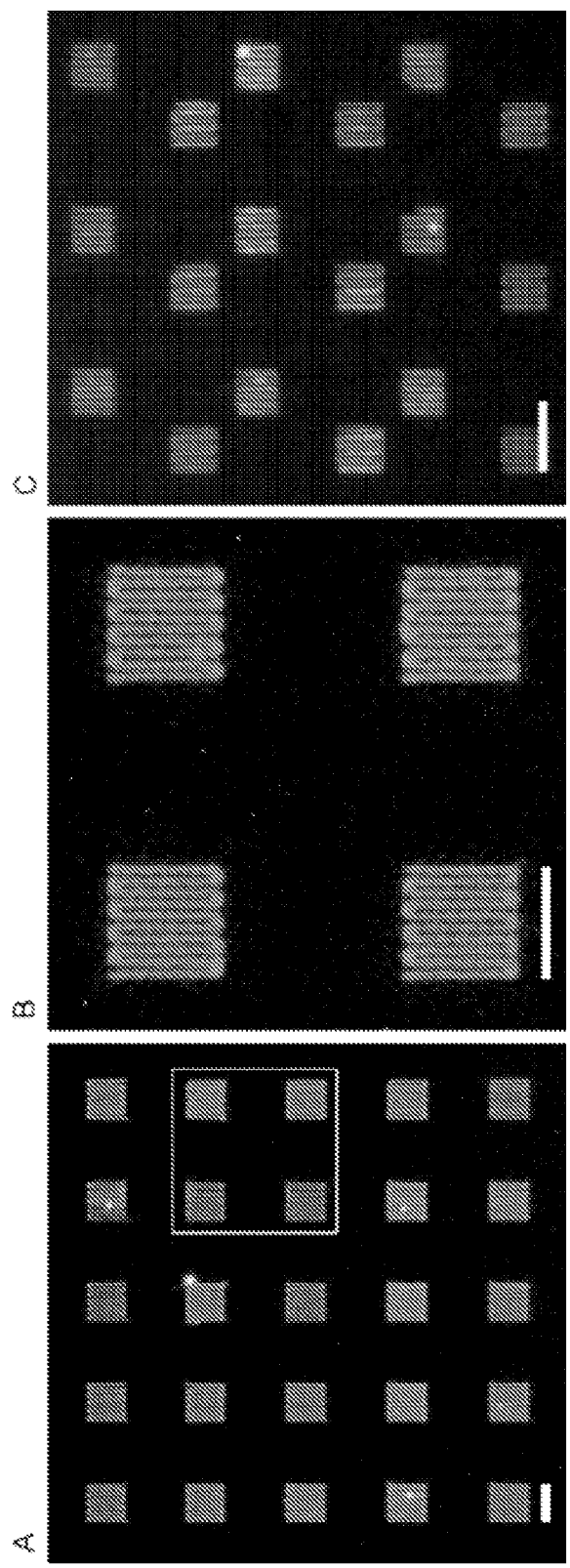
FIG. 12. Fluorophore-doped phospholipid patterns deposited onto a polystyrene Petri dish. A) An array of 25 contiguous line features. B) A higher magnification of the region highlighted by the white square in (A). Lines corresponding to the path of the atomic force microscope tip can be seen within each square; the line widths are 250 nm. C) Two-component pattern created serially by using two different tips inked with phospholipid doped with two different fluorescent dyes. Scale bars: 5 µm.

By careful optimization of the scan speed and relative humidity, the thickness of the material deposited to that of a single bilayer (FIG. 1A) with line widths down to (93±18) nm, as determined by AFM (see FIG. 16) can be controlled. A fluorescence micrograph of a serially patterned array of 25 features of DOPC doped with 1 mol % of a rhodamine-labeled lipid shows that one can routinely prepare features comprising contiguous lines (FIG. 12). Structures with two different dye layers (the green pattern being DOPC doped with 1 mol % of a 7-nitro-2,1,3-benzoxadiazol-4-yl (NBD) labeled lipid) on the same substrate were also fabricated by serial DPN (FIG. 12C). Since the physisorbed patterns are swept away when imaged in contact mode, nanoscale alignment marks using the same tip for DPN writing and imaging could not be used. Therefore, optical alignment marks were used to align the different tips, which resulted in a misalignment of about 2 μm between the two layers.

Figure 13:
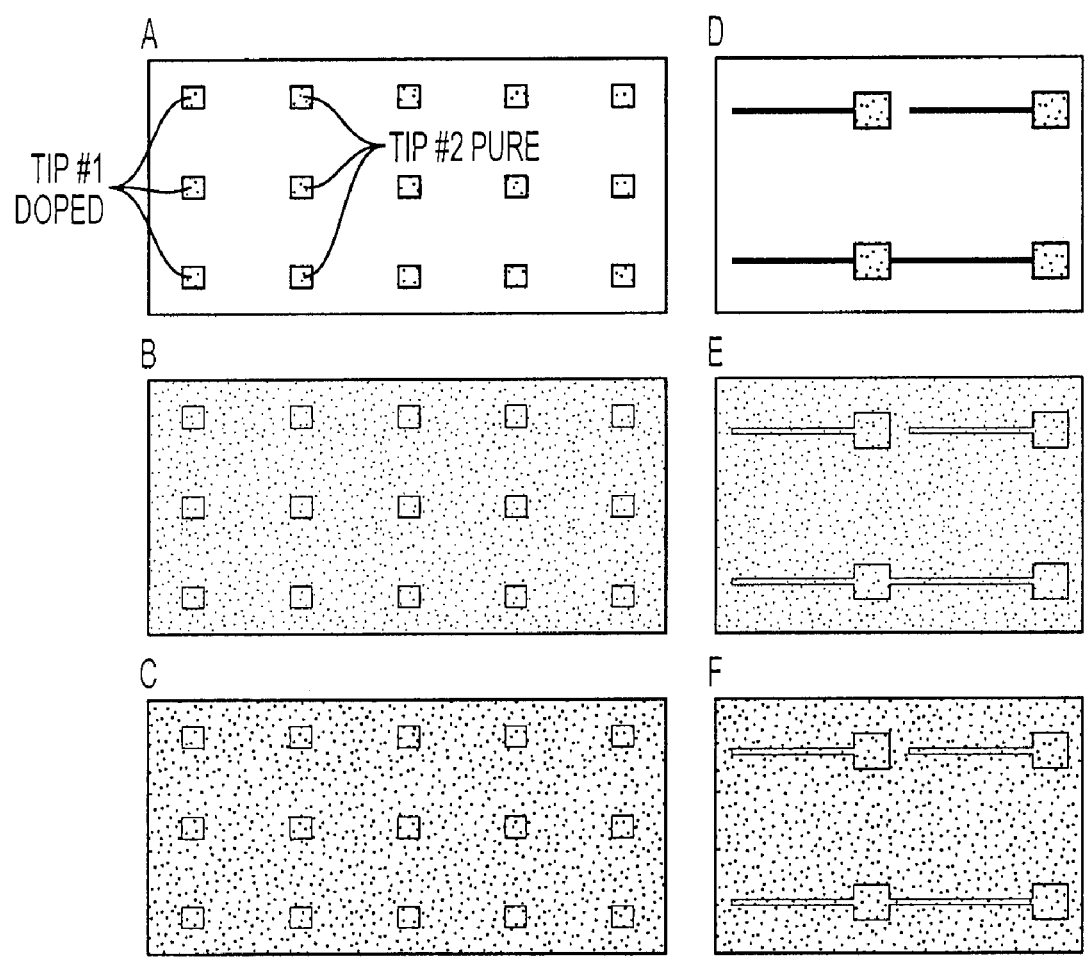
FIG. 13. Parallel writing of two different inks (fluorophore-doped and pure DOPC) as test of membrane fluidity. A) Schematic drawing of the heterogeneous ink pattern programmed to be fabricated in parallel from a one-dimensional array of atomic force microscope tips. B) Bright-field micrograph of the phospholipid squares (doped and pure) that were fabricated simultaneously. C) Fluorescence micrograph of the same area in (B) showing that only the doped squares fluoresce. D) Schematic drawing of the pattern fabricated to test the fluidity by connecting fluorophore-doped DOPC reservoirs with their neighbors of pure DOPC. E) Bright-field micrograph of the connected squares (bottom) and an unconnected control (top). F) Fluorescence micrograph showing that the fluorophore-doped lipid has diffused into the previously pure lipid square upon connection, which demonstrates the fluidity of the membranes. Scale bar: 5 µm.

A major advantage of at least some of these embodiments over other lithographic techniques is that different inks can be simultaneously deposited from different atomic force microscope tips in a single array, provided that the two inks can write under the same environmental conditions (if this is not the case, then active pen arrays may become important to deposit the different materials in series (33,34)). This method is used to test the fluidity of the DOPC patterns (FIG. 13). In this experiment, inkwells are used to coat every second tip in a one-dimensional array with fluorophore-doped DOPC, while the other tips are coated with pure DOPC. FIG. 13A shows a simple pattern where each tip was programmed to deposit three squares. Fluorescence is only observed from the patterns created by every second tip, thus eliminating the possibility of cross-contamination between neighboring tips (FIG. 3B). Each square was then connected to the neighboring squares of different composition by drawing a fine line of the same ink. Upon connecting the squares, the fluorescent dye diffuses into the pure lipid squares, which indicates that the phospholipid patterns retain their fluidity at humidity levels>40% (FIG. 13 D-F).

Figure 14:
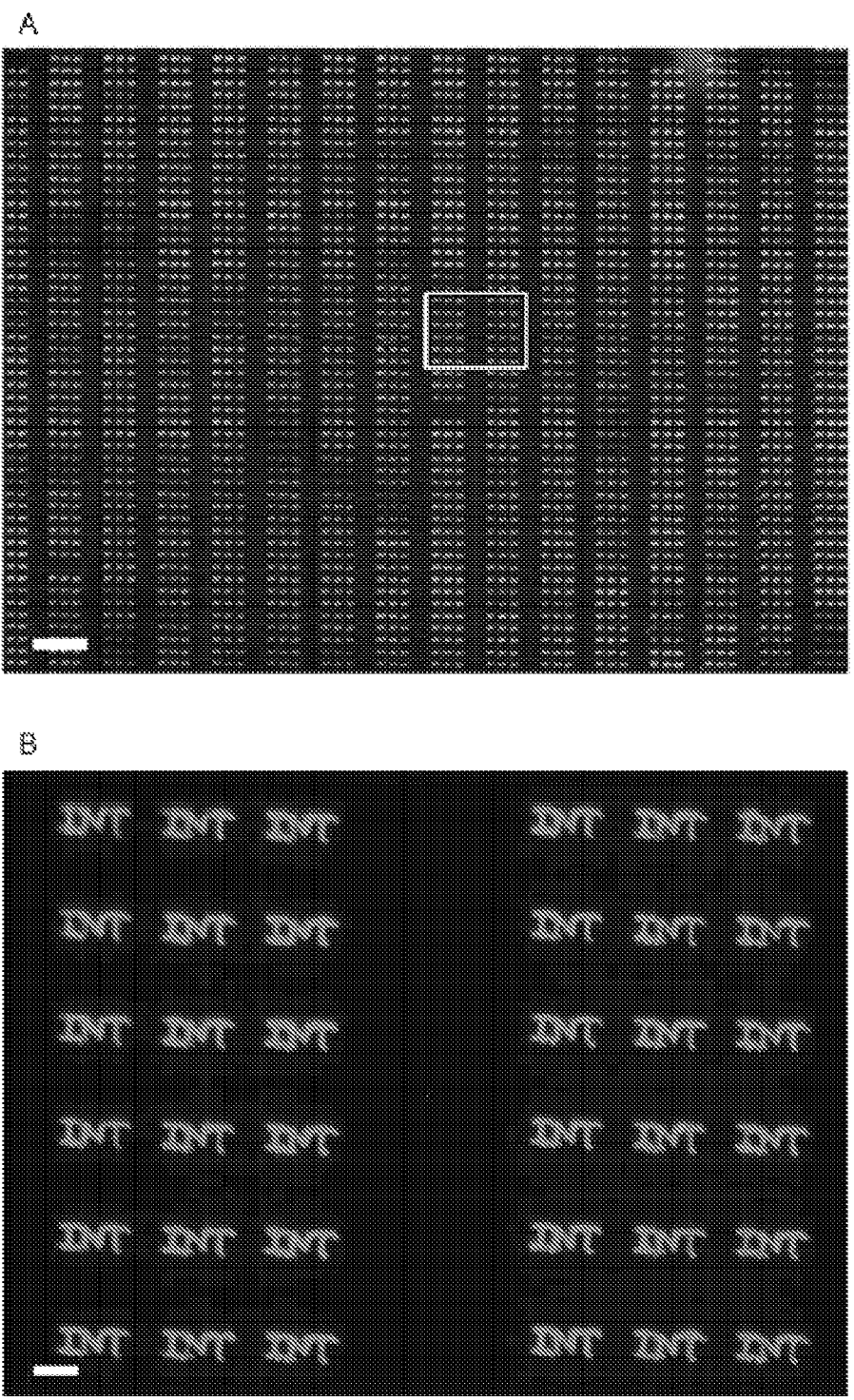
FIG. 14. Fluorescence micrographs of phospholipid patterns fabricated in parallel using a two-dimensional cantilever array comprising 55,000 tips covering 1 cm$^2$. A) Overview showing the patterning of a large area; scale bar: 100 µm. B) A higher magnification of the area outlined by the white square in (A); scale bar: 10 µm. The substrate here was a glass coverslip used as purchased, without further cleaning or treatment.

DPN is well suited to large-scale parallel deposition of lipid membranes, because the pattern dimensions are independent of the contact force of the microscope tip on the substrate. To illustrate this, a two-dimensional cantilever array comprising 55,000 tips was used to simultaneously pattern over a surface area of 1 $cm^2$ (FIG. 14). Each tip wrote "INT" three times at 70% relative humidity and the total writing time required was only 12 seconds. This surface was later immersed in pure water, and the fluorescent patterns were still visible in the water after overnight storage (see FIG. 17). One can attribute the stability of the multilayer patterns in water to the partial wetting of phospholipids on the substrate. For this situation to occur, the interfacial tensions involved (solid/water, solid/lipid, water/lipid) must be such that spreading is thermodynamically unfavorable, thus resulting in a nonzero contact angle (35).

Upon exposure to water, dehydrated phospholipids are known to spontaneously spread to form lipid membranes on hydrophilic surfaces (36, 37). It is found that the dehydrated multilayer patterns formed by DPN to be suitable precursors for the formation of such membranes. Multilayer squares patterned on hydrophilic glass (oxidized by an oxygen plasma) spread to form circles of homogeneous fluorescence intensity, which eventually fused with their neighbors. Fluorescence recovery after photobleaching (FRAP) measurements on membranes connected to their neighbors showed complete recovery, which indicated the fluidity and connectivity of the patterns (see FIG. 18).

The hydrated phospholipid DOPC can be used as a universal ink for noncovalent patterning on a variety of surfaces, ranging from hydrophilic silicon to plastic such as for example hydrophobic polystyrene. The lateral resolution spans the 100-nm to several micrometer length scales, and the patterning can be carried out in parallel using cantilever arrays on the centimeter length scale. Simultaneous writing of different inks enables the precise alignment and integration of chemically distinct phospholipid patterns. The resulting multilayer patterns are fluid and stable on certain surfaces upon immersion in water, while on other surfaces they can spread to form supported lipid bilayer membranes. Furthermore, the ability of DPN to fabricate and integrate arbitrary phospholipid patterns of submicrometer line widths opens many new possibilities in the design of membrane chemical heterogeneity (e.g., lipid raft arrays (2,3)) and membrane structural constructs (e.g., lipid nanotube-vesicle networks (38)), where it is desirable to create complex physical and chemical membrane networks.

The parallel lithography with two-dimensional pen arrays in some embodiments may be used to produce two-dimensional arrays of different patterning compositions such as compositions comprising a lipid. Patterning compositions can be formulated and adapted for transfer and deposition from the tip to a substrate surface. In some embodiments, the compositions may comprise two or components including one or more lipids and one or more patterning species. An optional solvent system can be also used, and the amount of solvent can be varied by use of for example drying steps or humid atmosphere. The patterning composition can be formulated to exclude components and amounts of components which would interfere with the deposition process, wherein the patterning composition consists essentially of the ingredients needed to carry out a successful result. Patterning compositions may be dried, partially or fully, on the tip before the deposition step.

Lipids

The patterning composition can comprise one or more lipids, and lipids are generally known in the art. See for example, Bohinski, *Modern Concepts in Biochemistry*, 4$^{th}$ Ed., Chapter 8, "Lipids and Biomembranes." For example, lipids can be simple lipids, compound lipids, or derived lipids. Simple lipids can be for example acylglycerols or waxes. Compound lipids can be for example phosphoacylglycerols, sphingomyelins, cerebrosides, or gangliosides. Derived lipids can be for example steroids, carotenoids, or lipid vitamins.

For lipids known in the art, see also, for example, chapter 33, as well as the entire textbook of *Organic Chemistry* 6$^{th}$ ed., Morrison and Boyd, Prentice hall, Englewood cliffs, N.J. 1992; chapter 2, as well as the entire textbook of *Molecular biology of the cell* 3$^{rd}$ ed., Alberts et al., Garland publishing, New York, N.Y., 1994; and chapter 21, as well as the entire textbook of *Organic Chemistry* 3$^{rd}$ ed., Loudon, the Benjamin/Cummings publishing co., Redwood city Calif., 1995.

Lipids can be used which are natural or synthetic. The lipid can be able to form liposomes in aqueous solution, either on its own or in combination with other lipids.

Lipids can be compounds comprising long hydrocarbon chains which can result in them being insoluble in water but soluble in nonpolar organic solvents.

Additional examples of lipids include fats, oils, steroid and waxes.

Glycerides are one type of lipids which are formed from glycerol and fatty acids. Glycerol comprises three hydroxyl groups which upon esterification with one, two or three fatty acids forms monoglycerides, diglycerides and triglycerides respectively. If one of the fatty acids is replaced with a sugar or a phosphate the resulting compound is a glycolipid or a phospholipid respectively. The fatty acids can be unsaturated, saturated, monounsaturated or polyunsaturated. Examples of unsaturated fatty acids includes, oleic, linoleic, linolenic and arachidonic acid. Examples of saturated fatty acids includes, myristic, palmitic and stearic acids. Further, the fatty acids may adopt a cis or trans configuration. The length of the fatty acid chain may vary. For example, the fatty acid hydrocarbon chain may comprise more than 3 carbon atoms, between 3-18 atoms or between 12-20 carbon atoms. The chain may or may not be branched. In one embodiment, the lipid compound comprises a phosphate group. In another embodiment, the lipid compound comprises a sugar group. In one embodiment, the lipid compound comprises one, two or three fatty acids. In a further embodiment, the lipid compound comprises at least one fatty acid which is saturated, monounsaturated or polyunsaturated. The lipid can comprise two fatty acids. At least one fatty acid can be monounsaturated. Both fatty acids can be monounsaturated. The fatty acid may be cis or trans. In one embodiment, at least one fatty acid comprises at least 3 carbon atoms. In another embodiment, at least one fatty acid comprises between 3 and 18 carbon atoms, including all integers in between. In another embodiment, at least one fatty acid comprises between 12 and 20 carbon atoms including all integers in between.

In one embodiment the lipid compound is a phospholipid comprising an amino group. The amino group may be primary, secondary, tertiary or quaternary. Preferably the amino group is quaternary. More preferably the amino group can be bonded to an oxygen atom of the phosphate group. Most preferably the amino group can be bonded to the oxygen atom through at least one carbon atom.

In another embodiment, the lipid compound comprises a phospholipid derivative. Non limiting examples include phophacholine, phosphoglycerol, phosphatidic acid, phosphoserine, PEG phospholipid, and the like.

The lipid can exhibit a gel-liquid crystal transition temperature.

The molecular weight of the lipid can be for example 250 to about 2,000, or about 500 to about 1,500, or about 500 to about 1,000.

In one embodiment, lipids can be used which can self assemble into membranes including lipid bilayers, so that the lipid is a lipid capable of self-assembling into a lipid bilayer. See for example US Patent Publication No. 2006/0094053 regarding lipid bilayers.

In another embodiment, the lipid can be represented by the structure of formula I wherein, for example, $R_1$ and $R_2$ are independently selected, each representing a saturated, monosaturated, unsaturated, or polysaturated carbon chain with 3-20 carbon atoms.

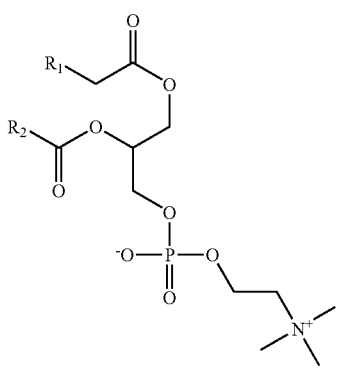

(I)

One example of a lipid is DOPC as described further below in the working examples. Other examples include POPC and DMPC. See for example Lenhart et al., *Small,* 2007, 3, no. 1, 71-75 for lipids which can be patterned.

REFERENCES

[1] P. Yeagle, The Structure of Biological Membranes, 2nd ed., CRC Press, Boca Raton, Fla., 2005.
[2] L. Rajendran, K. Simons, J. Cell Sci. 2005, 118, 1099.
[3] K. D. Mossman, G. Campi, J. T. Groves, M. L. Dustin, Science 2005, 310, 1191.
[4] T. P. Lele, C. K. Thodeti, D. E. Ingber, J. Cell. Biochem. 2006, 97, 1175.
[5] M. Arnold, E. A. Cavalcanti-Adam, R. Glass, J. Blummel, W. Eck, M. Kantlehner, H. Kessler, J. P. Spatz, ChemPhysChem 2004, 5, 383.
[6] M. Tanaka, E. Sackmann, Nature 2005, 437, 656.
[7] D. Anrather, M. Smetazko, M. Saba, Y. Alguel, T. Schalkhammer, J. Nonosci. Nanotechnol. 2004, 4, 1.
[8] S. Majd, M. Mayer, Angew. Chem. 2005, 117, 6855; Angew. Chem. Int. Ed. 2005, 44, 6697.
[9] V. Yamazaki, O. Sirenko, R. J. Schafer, L. Nguyen, T. Gutsmann, L. Brade, J. T. Groves, BMC Biotechnol. 2005, 5, 18.
[10] M. Wu, D. Holowka, H. G. Craighead, B. Baird, Proc. Natl. Acad. Sci. USA 2004, 101, 13 798.
[11] A. S. Cans, N. Wittenberg, R. Karlsson, L. Sombers, M. Karlsson, 0. Orwar, A. Ewing, Proc. Natl. Acad. Sci. USA 2003, 100, 400.
[12] J. S. Hovis, S. G. Boxer, Langmuir 2001, 17, 3400.
[13] J. T. Groves, N. Ulman, S. G. Boxer, Science 1997, 275, 651.
[14] B. L. Jackson, J. I T. Groves, J. Am. Chem. Soc. 2004, 126, 13 878.
[15] D. S. Ginger, H. Zhang, C. A. Mirkin, Angew. Chem. 2004, 116, 30; Angew. Chem. Int. Ed. 2004, 43, 30.
[16] R. D. Piner, I. Zhu, F. Xu, S. H. Hong, C. A. Mirkin, Science 1999, 283, 661.
[17] L. M. Demers, D. S. Ginger, S. J. Park, Z. Li, S. W. Chung, C. A. Mirkin, Science 2002, 296, 1836.
[18] K. B. Lee, S. J. Park, C. A. Mirkin, J. C. Smith, M. Mrksich, Science 2002, 295, 1702.
[19] K. B. Lee, E. Y. Kim, C. A. Mirkin, S. M. Wolinsky, Nano Lett. 2004, 4, 1869.
[20] K. Salaita, S. W. Lee, X. F. Wang, L. Huang, T. M. Dellinger, C. Liu, C. A. Mirkin, Small 2005, 1, 940.
[21] K. Salaita, Y. Wang, J. Fragala, R. A. Vega, C. Liu, C. A. Mirkin, Angew. Chem. 2006, 118, 7257; Angew. Chem. Int. Ed 2006, 45, 7220.
[22] This technique is also compatible with other phospholipids; for instance, 1-palmitoyl-2-oleoyl-sn-glycero-3-phosphocholine (POPC, $T_m=-2.6°$ C.) and 1,2-dimyristoyl-sn-glycero-3-phosphocholine (DMPC, $T_m=23.5°$ C.) have been successfully patterned. Pure POPC and POPC mixed with 20% cholesterol were readily patterned under the same conditions as DOPC. DMPC could be patterned at 35° C. and 75% humidity, but not at lower temperatures. This finding suggests that the phospholipid ink must be at least 10° C. above its gel-liquid crystal transition temperature.
[23] A. S. Ulrich, M. Sarni, A. Watts, Biochim. Biophys. Acta 1994, 1191, 225.
[24] H. Binder, Appl. Spectrosc. Rev. 2003, 38, 15.
[25] E. Strandberg, T. Sparrman, G. Lindblom, Adv. Colloid Interface Sci. 2001, 89, 239.
[26] S. Tristram-Nagle, H. I. Petrache, J. F. Nagle, Biophys. J. 1998, 75, 917.
[27] S Schuy, A. Janshoff, ChemPhysChem 2006, 7, 1207.
[28] Y. Fang, A. G. Frutos, J. Lahiri, ChemBioChem 2002, 3, 987.
[29] J. Haaheim, R. Eby, M. Nelson, J. Fragala, B. Rosner, H. Zhang, G. Athas, Ultramicroscopy 2005, 103, 117.
[30] B. L. Weeks, J. J. DeYoreo, J. Phys. Chem. B 2006, 110, 10 231.
[31] B. L. Weeks, M. W. Vaughn, J. J. DeYoreo, Langmuir 2005, 21, 8096.
[32] S. Rozhok, P. Sun, R. Piner, M. Lieberman, C. A. Mirkin, J. Phys. Chem. B 2004, 108, 7814.
[33] D. Bullen, C. Liu, Sens. Actuators A 2006, 125, 504.
[34] D. Bullen, S. W. Chung, X. F. Wang, J. Zou, C. A. Mirkin, C. Liu, Appl. Phys. Lett. 2004, 84, 789.
[35] F. Brochard-Wyart, in Soft Matter Physics (Ed.: C. E. W. M. Daoud), Springer, Berlin, 1995, p. 1.
[36] J. Nissen, K. Jacobs, J. O. Radler, Phys. Rev. Lett. 2001, 86, 1904.
[37] M. C. Howland, A. R. Sapuri-Butti, S. S. Dixit, A. M. Dattelbaum, A. P. Shreve, A. N. Parikh, J. Am. Chem. Soc. 2005, 127, 6752.
[38] M. Karlsson, K. Sott, M. Davidson, A. S. Cans, P. Linderholm, D. Chiu, O. Orwar, Proc. Natl. Acad. Sci. USA 2002, 99, 11 573.

The various embodiments are further illustrated by the following non-limiting examples.

Working Examples

Using conventional photolithographic techniques, a 55,000 pen two-dimensional array was fabricated (pen yield>98%; pen spacing 90×20 μm, FIG. 1a). The challenge of leveling all 55,000 pens over a substrate during a patterning experiment was overcome, without the need for independent feedback on each tip. Several important parameters were developed.

First, arrays of $Si_3N_4$ (or silicon rich nitride material) cantilevers with pyramidal tips were fabricated such that the tips are about three times larger than conventional silicon nitride AFM tips (the apex of each tip was 7.6±0.2 μm taller than its cantilever base).

Second, the cantilevers were bent at a ~20° angle from their base by coating them with 25 nm of Au (and 5 nm Ti adhesion layer) and then annealing at 300° C. This curvature may be a result of the different thermal expansion coefficients of $Si_3N_4$ and Au (see, for example, Wenzler, et al. T. P. *Rev. Sci. Instrum.* 67, 4191-4197 (1996)). This array architecture leads to greater tolerance to the substrate morphology and inherent tip misalignment within the array (±10 μm misalignment can be compensated).

Third, gravity (~20 nN/tip), instead of a complex set of feedback systems, was used to bring all of the tips in contact with a sacrificial substrate prior to use.

Finally, the tip array was locked into position with respect to the piezo scanner head by taking advantage of the malleability of a rapidly curing epoxy resin (see supplementary information). This alignment procedure was useful so all of the tips within the array could be engaged and disengaged in a deliberate and controlled fashion without a feedback system. Once engaged, the pen array can be used to directly write virtually any pattern of molecules on the underlying substrate and simultaneously generate about 55,000 duplicates.

To test the writing capabilities of the pen array, its cantilevers were uniformly coated with 1-octadecanethiol (ODT) by vapor deposition and subsequently used to pattern a 25 nm film of polycrystalline gold on an oxidized silicon substrate with a 5 nm Ti adhesion layer. Using ODT as a chemical etch resist, the molecular patterns were developed into gold nanostructures, allowing the use of an optical or scanning electron microscope to characterize the patterns over large areas. In an initial experiment, the 55,000 pen array was used to generate 88 million dot features (each tip generating 1,600 100±20 nm dots in a 40×40 array) in less than 20 min (FIG. 1b). Significantly, >99% of all the pens (excluding 1-2% of pens damaged during processing) are in operation. AFM and SEM images confirm that registry and alignment are maintained within the field of view of each tip and between tips as well. One can even generate very sophisticated structures using this approach along with integrated software that controls the relative movement of the tip array over the underlying substrate. Indeed, the likeness of Thomas Jefferson was taken from a 2005 United States five cent coin and duplicated about 55,000 times at a pixel resolution of 80 nm (FIG. 1c).

Materials. Gold substrates were prepared according to literature procedures. (Weinberger et al., *Advanced Materials*, 12, 1600 (2000); Zhang et al., *Langmuir*, 20, 962-968 (2004). 1-octadecanethiol (ODT) (98%) and 1-octanol (99%) were purchased from Aldrich Chemical Co. Fe(NO$_3$)$_3$9H$_2$O (99%) was purchased from Acros Chemicals, thiourea (ACS grade) was purchased from Fisher Scientific, and ethanol (ACS/USP grade) was purchased from Pharmco Products Inc. 5-min epoxy gel was purchased from Devcon and used as specified by the manufacturer. All chemicals were used as received.

Fabrication of 55,000 Cantilever Arrays: The Microfabrication process used to generate the tips was designed to be simple and robust, which affords high yields and is amenable for future modifications (FIG. 2). A 200 nm layer of silicon oxide was thermally grown (950° C., 30 min) on a silicon <100> wafer and lithographically patterned with 10 micron square openings at a spacing of 90×20 microns. The oxide patterns were then used as an etch mask for an anisotropic silicon etch (37% KOH, 20 min) to form pyramidal tip molds in the silicon wafer. The oxide etch mask was removed in buffered HF (6:6:1 H$_2$0:NH$_4$F:HF, 5 min), and a 400 nm thick thin film of Si$_3$N$_4$ was deposited using a low pressure, low stress chemical vapor deposition process. The Si$_3$N$_4$ layer on the front side of the wafer was then lithographically patterned to form arrays of cantilevers. No oxide layer remains on the backside.

Separately, a Pyrex wafer was coated with a 200 nm thick chromium layer and lithographically patterned to form 100 micron rectangular trenches. The Pyrex was etched in a reactive ion etcher, forming 8 micron recesses to allow the cantilevers free movement, and the chromium was then removed.

Figure 3:
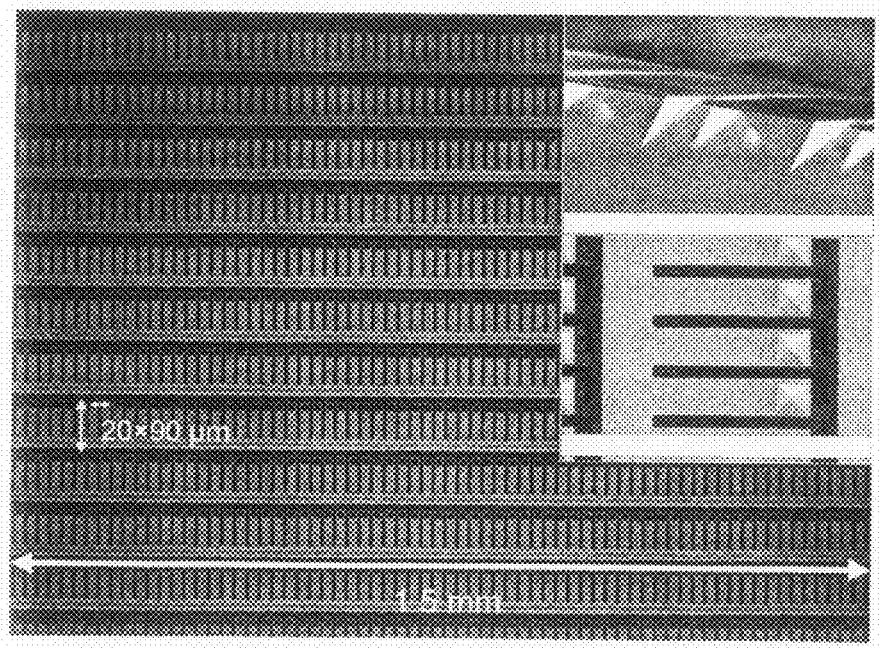
FIG. 3. Optical micrograph of part of a 2D 55,000 pen array. Insets are SEM images of the pen array from side view (top), and top view (bottom), respectively.

The nitrided silicon wafer and the Pyrex wafer were then electrostatically bonded, and the back of the Pyrex wafer was scribed into 1 cm$^2$ substrates by a diamond saw. Finally, the silicon wafer was etched, leaving the nitrided tip arrays attached to the Pyrex. The resulting cantilever structures were characterized by optical and electron microscopy (FIG. 3). The measured radius of curvature for fabricated tip arrays was 60 nm±20 nm.

The force constant (k) of a fixed-free cantilever beam with a length, width, and thickness of l, w, and t is given by k=Ewt$^3$/4l$^3$ (1), under a small displacement assumption. The term E denotes the modulus of elasticity of the probe material. The approximate modulus of elasticity is 145 GPa for the thin film of low-stress deposited layer of Si$_3$N$_4$. The cantilevers had measured dimensions of l=45 microns, w=14.5 microns, and t=400 nm, which correspond to a force constant k=0.40±0.10 N/m. Annealing of pen arrays. To induce tip curling away from the cantilever base, the tip-side of the cantilevers were first coated with a 5 nm Ti adhesion layer and 25 nm Au using a BOC 306 Edwards vacuum evaporator operated at a base pressure below 5×10−7 mbar. Subsequently, the pen arrays were placed in an oven, held at 300° C. for 2 hr, and then slowly cooled to room temperature at a rate<5° C./min. The degree of cantilever bending was inspected by optical microscopy and quantitatively measured by SEM. Although annealing the pen arrays at 400° C. induced a larger degree of cantilever bending, the high temperature also resulted in coarsening of the gold grains due to enhanced Au diffusion. Therefore, 300° C. was chosen as the annealing temperature. Cantilever bending is caused by the different thermal expansion of gold ($\alpha_{Au}$=13.8×10$^{-6 \circ}$ C.$^{-1}$) and Si$_3$N$_4$ ($\alpha_{Si_3N_4}$=3.6×10$^{-6 \circ}$ C.$^{-1}$). By modeling the gold coated Si$_3$N$_4$ cantilevers as a bimorph system, the annealing induced curvature, expressed as the radius of an arc R, can be calculated from equation 2, $$R = \frac{3(D_1 + D_2)^2 D_1 D_2 E_1 E_2 + (D_1 E_1 + D_2 E_2)(D_1^3 E_1 + D_2^3 E_2)}{6\Delta\alpha\Delta T (D_1 + D_2) D_1 D_2 E_1 E_2} \quad (2)$$

where D is the thickness (D$_1$=D$_{Au}$=25 nm; D$_2$=D$_{Si_3N_4}$=400 nm), E is Young's modulus (E$_1$=E$_{Au}$=0.8×10$^{11}$ N m$^{-2}$; E$_2$=E$_{Si_3N_4}$=3.8×10$^{11}$ N m$^{-2}$, Δα is the difference in the coefficients of thermal expansion, and ΔT is the change in temperature. The deflection or distance moved by the free end of the cantilever d can be represented by d=L$^2$/2R, where L is the length of the cantilevers.

Heating the tips to 300° C. would produce the expected deflection or curling of 14 microns. However, the experimentally determined value is about 20-30 microns, which is most likely a result of deviations in the thickness of Au and the Si$_3$N$_4$ layers across the entire tip arrays. (Wenzler et al., *Review of Scientific Instruments*, 67, 4191-4197 (1996).

Ink Coating: The pen arrays were placed inside a sealed metal container with ODT (the pen arrays were attached to the cover of the container with a piece of double-sticky tape). The container was heated to 70° C. and held for 30 minutes, and then allowed to slowly cool. This vapor coating process was repeated (typically 2-3 times) until the tips were sufficiently coated with ODT for DPN printing experiments. Importantly, the coated pen array could be used to pattern more than 25 samples over a period of three days without the need of recoating the tips with more ODT ink.

Figure 4:
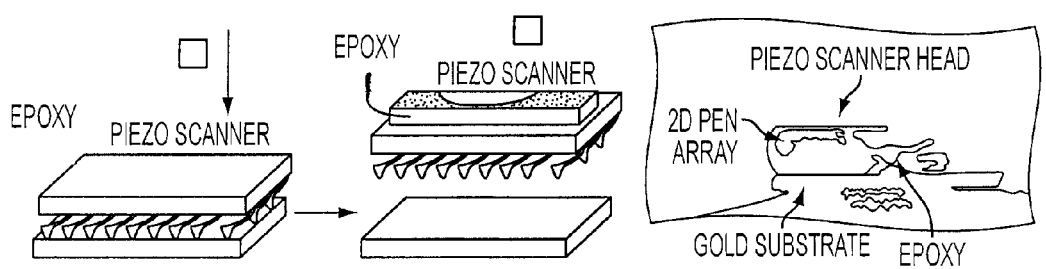
FIG. 4. (Left) Schematic diagram describing the procedure for mounting the pen array. (Right) Photograph depicting the mounted pen array being locked into the exact position as the epoxy hardens.
Figure 5:
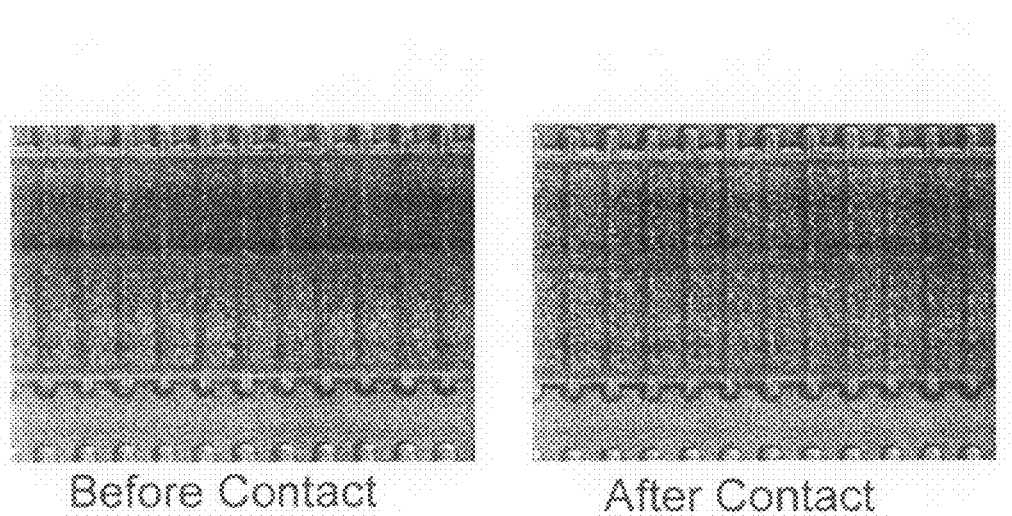
FIG. 5. Optical image of a 2D pen array before and after making contact with substrate.

Pen Array Mounting: The pen array was gently placed onto a sacrificial Au-coated SiOx substrate, letting the weight of the tip array (about 100 mg, 20 nN/tip) bring all tips into contact with substrate. An epoxy coated magnetic tip holder (1 cm×0.2 cm) was then gently brought down in contact with the Pyrex support of the pen array using the z motors of the AFM (FIG. 4, right). Enough pressure was applied using the motors (about 20-50 micron lower than the epoxy-tip array contact point) until the epoxy starts spreading to fill the void between the tip holder and the tip array (FIG. 4). The epoxy was then left to fully harden over a period of at least 1 hr. Note that it was important in this example to use a thin film of epoxy, avoiding excess, since epoxy can undergo a 1-10% volume shrinkage during polymerization. (Schoch et al., *Thermochimica Acta*, 417, 115-118 (2004); Ramos et al, *Polymer*, 46, 3323-3328 (2005). After the epoxy was fully cured, all the tips could then be engaged with the substrate by moving the z-motors to the same (+0.2 microns) curing position. Interestingly, tip-substrate contact can be observed by monitoring the bending-induced change in the optical reflectivity of the cantilevers (FIG. 5). Note that the Au-coating enhances tip reflectivity. The exact position of the tip-substrate contact is maintained to within ±1 micron, and over 20 substrates were patterned by coming back to the same z position. Remarkably, the pen arrays could be remounted on the scanner head and used for high resolution patterning. This system provided for successfully patterning over cm square areas after remounting the tip array on the scanner head. Remounting the magnetic tip holder was facilitated by allowing a small amount of epoxy to mold onto one edge of the scanner head.

Dip Pen Nanolithography: DPN experiments were performed with an Nscriptor™ (NanoInk, Inc., Chicago, Ill.) equipped with a 100-micron scanner and closed-loop scan control and commercial lithographic software (DPNWrite, ™DPN System-1, NanoInk, Inc., Chicago, Ill.). All DPN patterning experiments were carried out under ambient laboratory conditions without the aid of a clean room (about 30% relative humidity, about 20° C.).

Selective Etching of Au: Etching was performed on DPN-patterned gold substrates by immersing in a bath of 13.3 mM $Fe(NO_3)_3 9H_2O$, 20 mM thiourea, 0.3% HCl in octanol saturated nanopure water (15 mL of etch solution for a about 1 square cm substrate). (Xia et al., *Chemistry of Materials*, 7, 2332-2337 (1995); Geissler et al, *Langmuir*, 18, 2374-2377 (2002); Zhang et al., *Nano Letters*, 3, 43-45 (2003). The bath was gently stirred as the substrate was visually inspected for etching (rate about 6 nm/min). The color of the substrate changed from yellow to dark blue as the gold was dissolved.

Pattern Characterization. Patterned structures, post etching, were characterized by SEM (Leo Gemini 1525), and optical microscopy (Zeiss Axiovert 100A inverted microscope, Thornwood N.Y.) equipped with a Penguin 600CL digital camera and StreamPix software. These tools provide a relatively high throughput method for evaluating the quality of the patterned structures. Tapping mode AFM images were collected with a Nanoman AFM equipped with a Nanoscope IV controller from Veeco (Santa Barbara, Calif.) with silicon tips (NCH-W, Veeco, spring constant 40 N/m) scanned at a rate of 0.5 Hz and set to a pixel resolution of 512×512. Gold coated commercial AFM cantilevers (sharpened $Si_3N_4$, Type A, NanoInk, Inc.) with a spring constant of 0.05 N/m were used for contact mode imaging.

Figure 6:
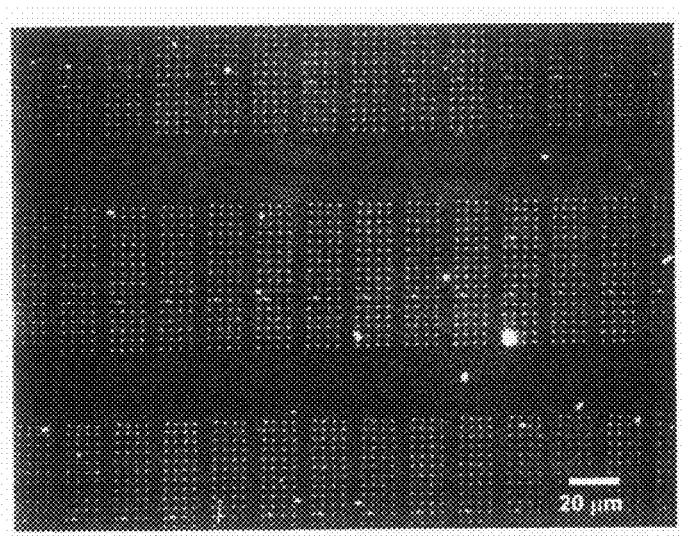
FIG. 6. Dark Field optical micrograph of Au dots in 4×16 arrays demonstrating the wide writing range of the 2D pen array.
Figure 7:
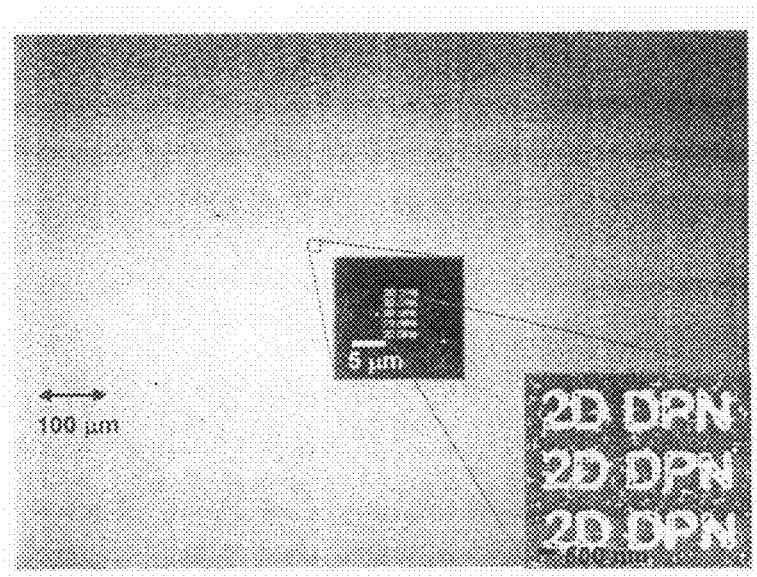
FIG. 7. Optical micrograph of Au structures drawn in shape of the characters "2D DPN" on a silicon substrate. Inset (center) shows dark field micrograph of one of the structures produced by one tip. Inset (right corner) is an SEM of these structures.
Figure 8:
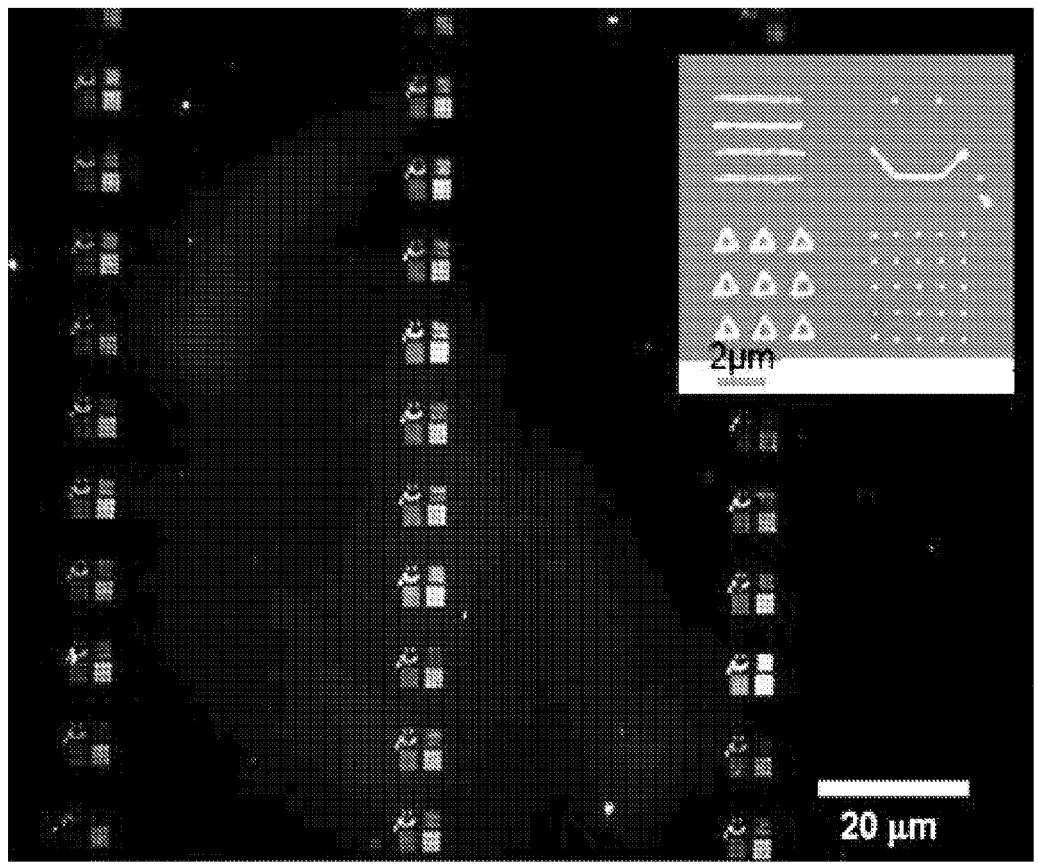
FIG. 8. Dark Field micrograph of a combinatorial Au structures. Each pen produced a set of structures divided into four quadrants comprising nine triangles, four lines, 25 dots, and a "smiley face." (inset) SEM shows one of these structures at high magnification.

Additional Examples of 2D Parallel DPN: Shown below are three additional examples that demonstrate the rapid prototyping capability of 2D parallel DPN reported herein. FIG. 6 shows Au dot arrays spanning nearly the entire writing range of each cantilever. FIG. 7 shows Au structures developed from molecular ODT patterns in the form of the characters "2D DPN." Each pen generated five structures occupying an area of 9×7 microns with a total patterning time of 9 min. FIG. 8 shows Au structures in the shape of nine triangle, four lines, 5×5 dots, and a "smiley face" occupying four quadrants of the patterning area of each pen. The total patterning time in this case was about five minutes. Note that these structures are just two examples and virtually any pattern geometry can be generated.

Figure 9:
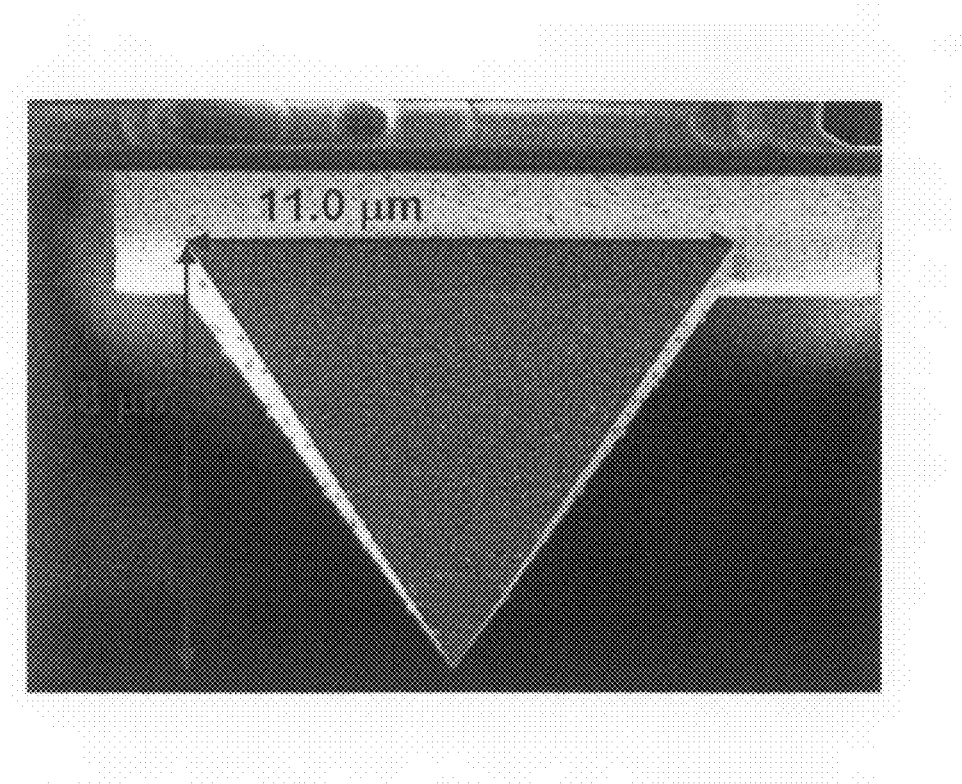
FIG. 9. SEM image of pyramidal tip, where the measured tip apex height is 8.8 microns and the base is 11.0 microns.

Apex height was measured for a pyramidal tip as shown in FIG. 9.

Figure 10:
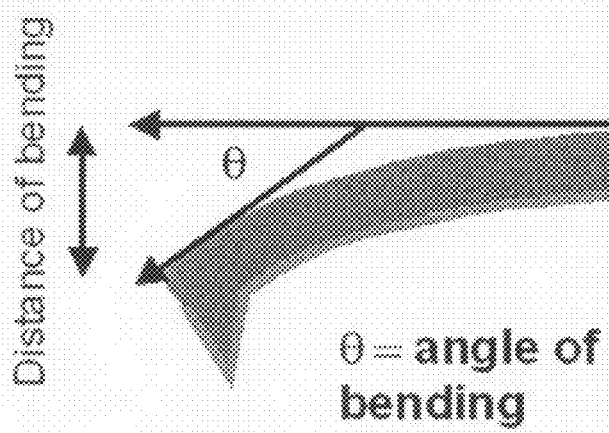
FIG. 10. Illustrating measurement of angle of cantilever bending and distance of cantilever bending.

FIG. 10 shows how distance of bending and angle of bending was measured when the cantilevers are bent at an angle from their base and the cantilevers are bent at an average distance.

Patterning of Phospholipid

The phospholipid DOPC and fluorophore-doped lipids 1,2-dioleoyl-sn-glycero-3-phosphoethanolamine-N-(7-nitro-2,1,3-benzoxadiazol-4-yl) (18:1 NBD/PE) and 1,2-dioleoyl-sn-glycero-3-phosphoethanolamine-N-(lissamine rhodamine B sulfonyl) (18:1 lissamine rhodamine/PE) were purchased from Avanti Polar Lipids, Alabaster, Ala., USA. Chloroform and dichloromethane solvents were HPLC grade, from Sigma. Nanopure water with a resistivity of 18.2 MΩcm was used.

DPN writing and tip coating was carried out using a commercial DPN writer (Nscriptor™) and the following accessories: single tips of the A type (SI), one-dimensional tip arrays of the D type (A26), and inkwells of type W4 (NanoInk Inc., Chicago, Ill., USA). The inkwells were filled with a chloroform or dichloromethane solution of the phospholipid ink (1 µl, 10 mm, doped with 1 mol % of the dye in the case of doped inks). The solvent was allowed to evaporate for at least 2 h before coating the tips. Tips were inked by placing them in contact with the inkwell and increasing the humidity to ≈95% for at least 30 min.

The two-dimensional array was fabricated and aligned as described by Mirkin et al. in *Angew. Chem.* 2006, 118, 7257. The tips were inked using an ink pad prepared by spin-coating the ink solution (0.5 mL) onto a glass slide at 1000 rpm. The array was aligned and placed in contact with an ink pad. To facilitate the movement of ink onto the tips, a drop (10 µl) of water was placed on the corner of the ink pad and allowed to spread through the phospholipid coating on the ink pad.

Figure 16:
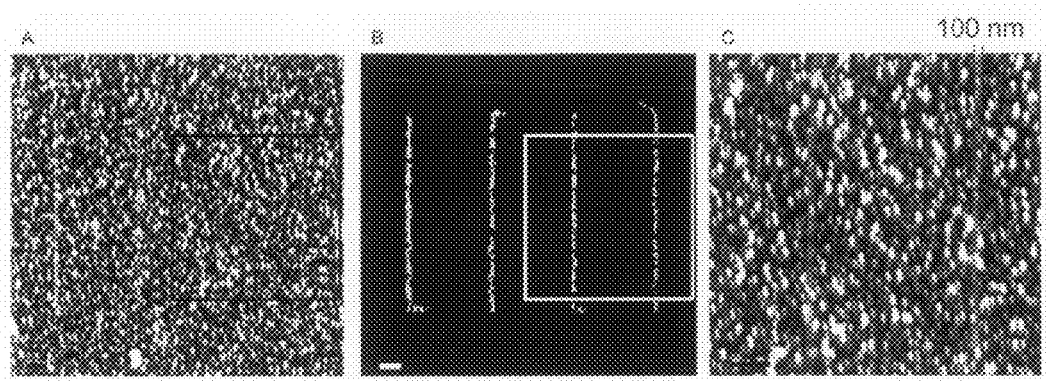
FIG. 16. AFM measurements of lines with widths down to 100 nM. A) Topographical image. B) Phase image. The substrate is a titanium film evaporated onto silicon. C) A topographical image of the area outlined in A and B. The line on the right side has a width of 93±18 nm. Mechanical damage was ruled out by carrying out the experiment with 1D arrays, inking only every second tip. The tips without ink then function as a negative control, and no pattern was present in the areas contacted by the control tips. Scale bars: 500 nm.

Rather than spreading laterally over the surface to form a monolayer like covalent DPN inks, the phospholipid ink tends to stack three dimensionally on the surface. The heights of the DOPC features measured by AFM exhibit a strong correlation with the tip velocity and the relative humidity (FIG. 11). A reflection-mode micrograph of DOPC films deposited from an atomic force microscope tip onto plasma-oxidized silicon by scanning 5-µm areas at various speeds exhibits different colors for each deposited square, a consequence of optical interference due to different film thicknesses (FIG. 11A). AFM measurements show a linear dependence of the film thickness on the logarithm of the tip velocity (FIG. 11B). The relative humidity plays an important role, both in the inking of the tip and in the multilayer stacking during writing. By careful optimization of the scan speed and relative humidity, the thickness of the material deposited was controlled to that of a single bilayer (FIG. 11A) with line widths down to (93±18) nm, as determined by AFM (FIG. 16).

A fluorescence micrograph of a serially patterned array of 25 features of DOPC doped with 1 mol % of a rhodamine-labeled lipid shows that one can routinely prepare features comprising contiguous lines (FIG. 12). Structures with two different dye layers (the green pattern being DOPC doped with 1 mol % of a 7-nitro-2,1,3-benzoxadiazol-4-yl (NBD) labeled lipid) on the same substrate were also fabricated by serial DPN (FIG. 12C).

The fluidity of the DOPC patterns (FIG. 13). In this experiment, inkwells are used to coat every second tip in a one-dimensional array with fluorophore-doped DOPC, while the other tips are coated with pure DOPC. FIG. 13A shows a simple pattern where each tip was programmed to deposit three squares. Fluorescence is only observed from the patterns created by every second tip, thus eliminating the possibility of cross-contamination between neighboring tips (FIG. 13B). Each square was then connected to the neighboring squares of different composition by drawing a fine line of the same ink. Upon connecting the squares, the fluorescent dye diffuses into the pure lipid squares, which indicates that the phospholipid patterns retain their fluidity at humidity levels>40% (FIG. 13 D-F).

Figure 17:
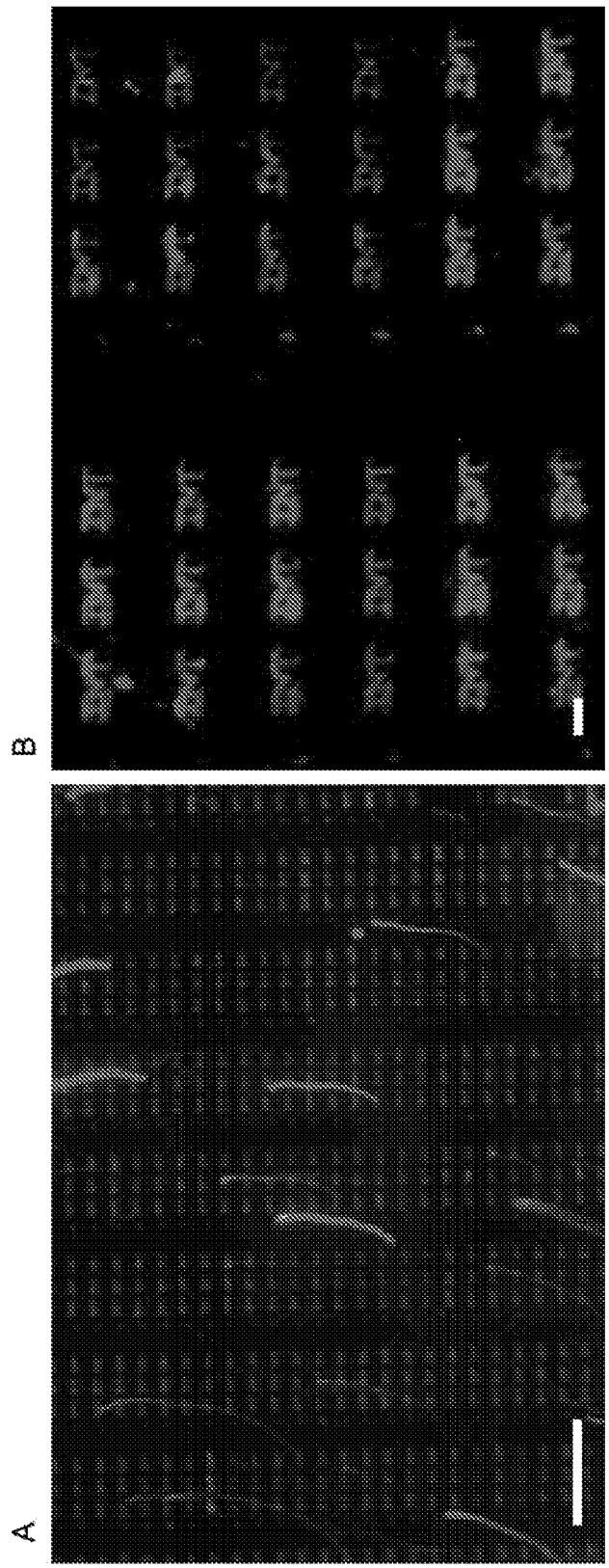
FIG. 17. Fluorescence micrographs of the DOPC patterns show in FIG. 13 after overnight storage in pure water. Vesicles moving through the solution appear as vertical streaks in A. In order to avoid exposure of the phospholipid patterns to the air water interface during immersion into the water, the patterned glass slides were immersed into liquid nitrogen prior to immersion. Scale bar is 100 µm in A and 10 µm in B.

A two-dimensional cantilever array comprising 55,000 tips was used to simultaneously pattern over a surface area of 1 cm$^2$ (FIG. 14). Each tip wrote "INT" three times at 70% relative humidity and the total writing time required was only 12 seconds. This surface was later immersed in pure water, and the fluorescent patterns were still visible in the water after overnight storage (FIG. 17).

Figure 18:
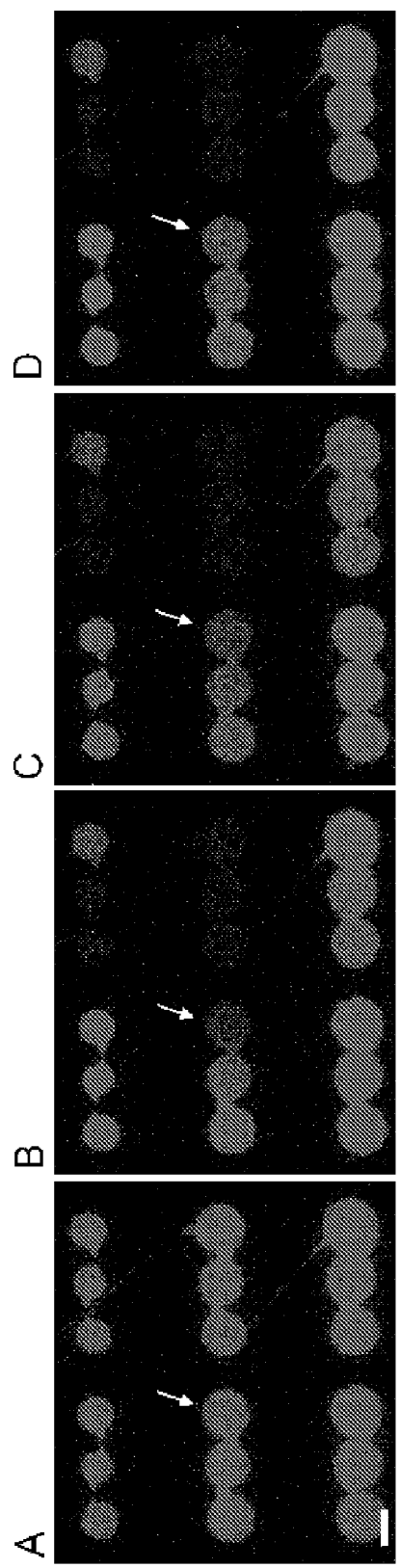
FIG. 18. Fluoropore doped DOPC patterns (5×5 µm) formed in air were allowed to spread upon immersion into a MES buffer (10 mM, pH 6.5) to form circles on hydrophilic glass. Fluorescence recovery after photobleaching (FRAP) on the patterns indicates the fluidity and connectivity of the patterns. The arrows shows a spot that was bleached and fully recovered. A) shows the pattern prior to bleaching, B) after bleaching, C) after 10 minutes (nearly full recovery), and D) after 20 minutes (full recovery). The membranes that are not connected to their neighbors do not recover. Scale bar is 20 µm.

Upon exposure to water, dehydrated phospholipids are known to spontaneously spread to form lipid membranes on hydrophilic surfaces. It was found the dehydrated multilayer patterns formed by DPN to be suitable precursors for the formation of such membranes. Multilayer squares patterned on hydrophilic glass (oxidized by an oxygen plasma) spread to form circles of homogeneous fluorescence intensity, which eventually fused with their neighbors. Fluorescence recovery after photobleaching (FRAP) measurements on membranes connected to their neighbors showed complete recovery, which indicated the fluidity and connectivity of the patterns (FIG. 18).

Additional Embodiments

Finally, in one embodiment, it is provided an article comprising: a two-dimensional array of a plurality of cantilevers, wherein the array comprises a plurality of base rows, each base row comprising a plurality of cantilevers extending from the base row, wherein each of the cantilevers comprise tips at the cantilever end away from the base row, wherein the array is adapted to prevent substantial contact of non-tip components of the array when the tips are brought into contact with a substantially planar surface; a support for the array.

In one embodiment, the tips have an apex height relative to the cantilever of at least four microns.

In one embodiment, the tips have an apex height relative to the cantilever of at least seven microns.

In one embodiment, the cantilevers are bent at an angle away from the support.

In one embodiment, the cantilevers are bent at an angle of at least 10° away from the support.

In one embodiment, the tips have an apex height relative to the cantilever of at least four microns, and wherein the cantilevers are bent at an angle away from the support.

In one embodiment, the tips have an apex height relative to the cantilever of at least seven microns, and wherein cantilevers are bent at an angle of at least 10° away from the support.

In one embodiment, the array is characterized by a tip spacing of less than 300 microns in a first dimension of the two dimensional array and less than 300 microns in a second dimension of the two dimensional array.

In one embodiment, the array is characterized by a tip spacing of less than 200 microns in a first dimension of the two dimensional array and less than 50 microns in a second dimension of the two dimensional array.

In one embodiment, the array is characterized by a tip spacing of 100 microns or less in at least one dimension of the two dimensional array.

In one embodiment, the number of cantilevers is greater than 250.

In one embodiment, the number of cantilevers is greater than 10,000.

In one embodiment, the number of cantilevers is greater than 55,000.

In one embodiment, each of the tips are characterized by a distance D spanning the tip end to the support, and the tip array is characterized by an average distance D' of the tip end to the support, and for at least 90% of the tips, D is within 50 microns of D'.

In one embodiment, each of the tips are characterized by a distance D spanning the tip end to the support, and the tip array is characterized by an average distance D' of the tip end to the support, and for at least 90% of the tips, D is within 10 microns of D'.

In one embodiment, the base rows have an average length of at least about 1 mm.

In one embodiment, the cantilevers comprise multiple layers adapted for bending of cantilevers.

In one embodiment, the cantilevers are bimorph cantilevers.

In one embodiment, the cantilevers are not adapted for feedback.

In one embodiment, at least one of the cantilevers is adapted for feedback.

In one embodiment, substantially all of the cantilevers are adapted for feedback.

In one embodiment, the base rows have a height with respect to the support of at least about 5 microns.

In one embodiment, the tips have an average radius of curvature of less than 100 nm.

In one embodiment, the tips have an average radius of curvature of about 10 nm to about 50 nm.

In one embodiment, the cantilevers have an average force constant of about 0.001 N/m to about 10 N/m.

In one embodiment, the cantilevers have an average force constant of about 0.05 N/m to about 1 N/m.

In one embodiment, the array support is characterized by a surface on the far side away from the cantilever tips comprising a surface area which is about two square cm or less.

In one embodiment, the array is characterized by a cantilever yield of at least 95%.

In one embodiment, the array is characterized by a cantilever yield of at least 98%.

In one embodiment, the cantilevers are bound to the base by a non-adhesive bonding.

In one embodiment, the tips are coated with a patterning compound.

In one embodiment, the cantilevers are bent on average about 10 microns to about 50 microns.

In one embodiment, the tips have an apex height relative to the cantilever of at least four microns, and wherein the cantilevers are bent at an angle away from the support, and wherein the array is characterized by a tip spacing of less than 300 microns in a first dimension of the two dimensional array and less than 300 microns in a second dimension of the two dimensional array.

In one embodiment, the tips have an apex height relative to the cantilever of at least seven microns, and wherein the cantilevers are bent at an angle of at least 10° away from the support, and wherein the array is characterized by a tip spacing of less than 300 microns in a first dimension of the two dimensional array and less than 300 microns in a second dimension of the two dimensional array.

In one embodiment, the tips have an apex height relative to the cantilever of at least seven microns, and wherein the cantilevers are bent at an angle of at least 10° away from the support, and wherein the array is characterized by a tip spacing of less than 200 microns in a first dimension of the two dimensional array and less than 50 microns in a second dimension of the two dimensional array.

In one embodiment, the number of cantilevers is greater than 250.

In one embodiment, the number of cantilevers is greater than 10,000.

In one embodiment, the cantilevers comprise multiple layers adapted for bending the cantilever.

In one embodiment, the cantilevers are bound to the base by a non-adhesive bonding.

In one embodiment, it is provided a two-dimensional array of a plurality of cantilevers, the cantilevers comprising tips at the cantilever ends, wherein the array is adapted to prevent substantial contact of non-tip components of the array when the tips are brought into contact with a substantially planar surface.

In one embodiment, it is provided a article comprising:
a two-dimensional array of a plurality of cantilevers, wherein the array comprises a plurality of base rows, each base row comprising a plurality of cantilevers extending from the base row, wherein each of the cantilevers comprise tips at the cantilever end away from the base,
wherein the tips have an apex height relative to the cantilever of at least four microns, and
a support for the array.

In one embodiment, the array is characterized by a cantilever yield of at least 95%.

In one embodiment, the array is characterized by a tip spacing of less than 200 microns in one dimension and a tip spacing of less than 50 microns in a second dimension.

In one embodiment, the number of cantilevers is at least 50,000.

In one embodiment, the tips are coated with a patterning compound.

In one embodiment, the cantilevers comprise multiple layers adapted for bending of cantilevers.

In one embodiment, the cantilevers are bent at an angle from their base.

In one embodiment, the cantilevers are not adapted for feedback.

In one embodiment, the tips have an apex height relative to the cantilever of at least seven microns.

In one embodiment, the tips have an apex height relative to the cantilever of at least seven microns, wherein the cantilevers are not adapted for feedback, and wherein the number of cantilevers is at least 250.

In one embodiment, it is provided an article comprising: a two-dimensional array of a plurality of cantilevers, wherein the array comprises a plurality of base rows, each base row comprising a plurality of cantilevers extending from the base row, wherein each of the cantilevers comprise tips at the cantilever end away from the base, wherein the cantilevers are bent at an angle from their base.

In one embodiment, the array is characterized by a cantilever yield of at least 95%.

In one embodiment, the array is characterized by a tip spacing of less than 200 microns in one dimension and a tip spacing of less than 100 microns in a second dimension.

In one embodiment, the number of cantilevers is at least 50,000.

In one embodiment, the tips are coated with a patterning compound.

In one embodiment, the cantilevers are not adapted for force feedback.

In one embodiment, the cantilevers are bent at an angle of at least 10° from their base.

In one embodiment, the cantilevers are bent on average about 10 microns to about 50 microns.

In one embodiment, the tips have an apex height relative to the cantilever of at least four microns.

In one embodiment, the cantilevers are not adapted for force feedback, the number of cantilevers is at least 250, and wherein the cantilevers are bent at an angle of at least 10° from their base.

In one embodiment, it is provided a method of making an article which comprises a two-dimensional array of a plurality of cantilevers, and a support for the array, the method comprising: forming a two dimensional array comprising a plurality of cantilevers comprising tips at their ends, wherein the cantilevers are supported on a sacrificial support structure; forming an array support comprising a plurality of base rows which are adapted for bonding to the two dimensional array comprising a plurality of cantilevers; bonding the cantilevers to the base rows; and removing the sacrificial support structure to release the cantilevers and form the array.

In one embodiment of the method, the array is adapted to prevent substantial contact of non-tip components of the array when the tips are brought into contact with a substantially planar surface.

In one embodiment of the method, the tips have an apex height relative to the cantilever of at least four microns.

In one embodiment of the method, the tips have an apex height relative to the cantilever of at least seven microns.

In one embodiment, the method further comprises the step of bending the cantilevers at an angle away from the support.

In one embodiment, the method further comprises the step of bending the cantilevers at an angle of at least 10° away from the support.

In one embodiment of the method, the tips have an apex height relative to the cantilever of at least four microns, and wherein the cantilevers are bent at an angle away from the support.

In one embodiment of the method, the tips have an apex height relative to the cantilever of at least seven microns, and wherein the cantilevers are bent at an angle of at least 100 away from the support.

In one embodiment of the method, the array is characterized by a cantilever yield of at least 95%.

In one embodiment of the method, the array is characterized by a tip spacing of less than 200 microns in one dimension and a tip spacing of less than 50 microns in a second dimension.

In one embodiment of the method, the number of cantilevers is greater than 10,000.

In one embodiment of the method, the base rows have an average length of at least about 1 mm.

In one embodiment of the method, the cantilevers comprise multiple layers adapted for bending of cantilevers.

In one embodiment of the method, the cantilevers are coated with metal on the tip side of the cantilever.

In one embodiment of the method, the cantilevers are not adapted for force feedback.

In one embodiment of the method, the base rows have a height with respect to the support of at least about 5 microns.

In one embodiment of the method, the tips have an average radius of curvature of less than 100 nm.

In one embodiment of the method, the cantilevers have an average force constant of about 0.1 N/m to about 1 N/m.

In one embodiment of the method, the cantilevers are bent at an angle of at least 10° from their base.

In one embodiment of the method, the cantilevers are bent on average about 10 microns to about 50 microns.

In one embodiment of the method, the bonding step is a non-adhesive bonding.

In one embodiment, the method further comprises the step of coupling the article to an instrument and using the article for printing.

In one embodiment of the method, the forming of the two dimensional array comprises microfabrication.

In one embodiment of the method, the forming of the array support comprises microfabrication.

In one embodiment of the method, after the bonding step, the array support is scribed into sections about 2 square cm or less.

In one embodiment of the method, after the bonding step, the array support is scribed into sections about 0.5 square cm to about 1.5 square cm.

In one embodiment of the method, each of the forming steps comprises microfabrication, and wherein the tips are adapted to prevent substantial contact of non-tip components of the array when the tips are brought into contact with a substantially planar surface.

In one embodiment of the method, wherein the tips have an apex height relative to the cantilever of at least four microns.

In one embodiment, the method further comprises the step of bending the cantilevers at an angle away from the support.

In one embodiment, the method further comprises the step of bending the cantilevers at an angle of at least 10° away from the support.

In one embodiment, it is provided a method comprising (1) micromachining a two dimensional array of cantilevers, wherein the cantilevers are adapted to bond with a device which both supports the cantilevers and can also couple the cantilevers to an instrument for motion, and (2) bonding the cantilevers to the device.

In one embodiment, it is provided a method for direct-write nanolithography comprising: directly writing nanostructures at a rate of at least 100,000 per minute, wherein the directly writing comprises contacting a tip having a patterning compound thereon with a substrate.

In one embodiment of the method, the rate is at least 1,000,000 per minute.

In one embodiment of the method, the rate is at least 4,000,000 per minute.

In one embodiment of the method, the nanostructures comprise dots.

In one embodiment of the method, the nanostructures comprise dots having diameter about 50 nm to about 1,000 nm.

In one embodiment of the method, the nanostructures are separated by a distance between about 50 nm and about 1,000 nm.

In one embodiment, it is provided an instrument comprising the article according to embodiment 1, 40, 41, or 51.

In one embodiment, it is provided a method comprising: preparing a two-dimensional array of a plurality of cantilevers, wherein the array comprises a plurality of base rows, each base row comprising a plurality of cantilevers extending from the base row, wherein each of the cantilevers comprise tips at the cantilever end away from the base row, contacting tips of the array with a sacrificial substrate under pressure, forming an aligned array on the substrate, optionally, attaching the aligned array to an instrument adapted for motion of the array.

In one embodiment of the method, the pressure is generated either externally or with gravity.

In one embodiment of the method, the attaching is an adhesive or mechanical attaching.

In one embodiment of the method, the method further comprises removing the sacrificial substrate from the tips of the array.

In one embodiment, the method further comprises the step of attaching the aligned array to an instrument adapted for motion of the array.

In one embodiment, it is provided a method comprising: providing a two-dimensional array of a plurality of cantilevers comprising tips at the cantilever end, aligning the tips with use of a sacrificial substrate to provide an aligned array, locking the aligned array with a device adapted for array motion.

All references cited herein are hereby incorporated by reference in their entirety.

The invention claimed is:

1. A method comprising:
providing a two-dimensional array of a plurality of cantilevers, wherein the array comprises a support comprising a plurality of base rows, each base row bonding to a plurality of cantilevers extending from the base row, wherein each of the cantilevers comprising a tip at a cantilever end away from the base row; wherein the array has a tip density of at least 10,000 per square inch, wherein the tips have a radius of curvature of less than 100 nm, and the number of cantilevers in the array is at least 55,000;
providing a patterning composition, wherein the composition comprises one or more lipids;
providing a substrate;
coating the tips of the cantilevers with the patterning composition; and
depositing at least some of the patterning composition from the tips to the substrate surface.

2. The method of claim 1, wherein the tip is an atomic force microscope tip.

3. The method of claim 1, wherein the lipids are natural or synthetic.

4. The method of claim 1, wherein the lipids are selected from fats, oils, steroids, waxes, and glycerides.

5. The method of claim 1, wherein the lipids comprise one or more hydrocarbon chains of 3 to 20 carbons.

6. The method of claim 5, wherein the hydrocarbon chains are saturated, monounsaturated, or polyunsaturated.

7. The method of claim 6, wherein the monounsaturated or polyunsaturated hydrocarbon chains are in a cis or trans configuration.

8. The method of claim 5, wherein the hydrocarbon chains are branched or straight.

9. The method of claim 1, wherein the lipids comprise fatty acids.

10. The method of claim 9, wherein the fatty acids form monoglycerides, diglycerides, or triglycerides.

11. The method of claim 9, wherein the fatty acids are saturated, monounsaturated, or polyunsaturated.

12. The method of claim 11, wherein the saturated fatty acids are myristic, stearic, or palmitic acid.

13. The method of claim 11, wherein the monounsaturated or polyunsaturated fatty acids are oleic, linoleic, or arachidonic acid.

14. The method of claim 1, wherein the lipids comprise sugar or phosphate moieties.

15. The method of claim 1, wherein the lipids are glycolipid or phospholipid.

16. The method of claim 15, wherein the phospholipid comprises an amino group.

17. The method of claim 16, wherein the amino group is primary, secondary, tertiary, or quaternary.

18. The method of claim 17, wherein the amino group is quaternary.

19. The method of claim 1, wherein the lipids are lipid derivatives.

20. The method of claim 19, wherein the lipid derivative is phosphocholine, phosphoglycerol, phosphatidic acid, phosphoserine, or PEG phospholipid.

21. The method of claim 1, wherein the lipid's M.W. is in a range of about 250 Da to 2000 Da.

22. The method of claim 21, wherein the lipid's M.W. is in a range of about 500 Da to about 1500 Da.

23. The method of claim 1, wherein the lipid of formula I,

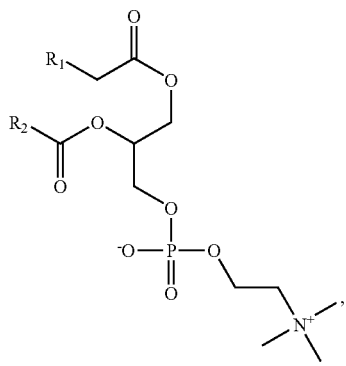

Formula I wherein $R_1$ and $R_2$ are independently selected, each representing a saturated, monounsaturated, or polyunsaturated carbon chain with 3-20 carbon atoms.

24. The method of claim 1, wherein the lipid is selected from 1,2-dioleoyl-sn-glycero-3-phosphocholine (DOPC), phosphoacylglycerol, sphingomyelin, cerebroside, and ganglioside.

25. The method of claim 1, wherein the tips are coated by the patterning composition at a relative humidity of at least 50%.

26. The method of claim 1, wherein the tips are coated by the patterning composition at the relative humidity of at least 70%.

27. The method of claim 1, wherein the tips are coated by the patterning composition at the relative humidity of at least 90%.

28. The method of claim 1, wherein the patterning composition is bound to the substrate surface through covalent bonding or non-covalent bonding.

29. The method of claim 1, wherein the patterning composition is bound to the substrate surface through physisorption.

30. The method of claim 1, wherein the substrate comprises a hydrophilic or hydrophobic surface which may be optionally modified.

31. The method of claim 1, wherein the substrate surface is selected from silicon, glasses, metals, polymers, mica, ceramics, composites, oxides, and complex mixtures.

32. The method of claim 1 wherein the substrate surface is glass.

33. The method of claim 1 wherein the substrate surface is polystyrene.

34. The method of claim 1, wherein the patterning composition is deposited onto the substrate surface to form a plurality of dots.

35. The method of claim 34 wherein the dots have diameter about 10 nm to about 1,000 nm.

36. The method of claim 34, wherein the dots are separated by a distance between 10 nm and 1,000 nm.

37. The method of claim 34 wherein the patterning rate is at least 100,000 dots per minute.

38. The method of claim 34 wherein the patterning rate is at least 1,000,000 dots per minute.

39. The method of claim 1, wherein the patterning composition is written onto the substrate surface to form a plurality of lines.

40. The method of claim 39, wherein the patterning rate is at least 1.0 meter per minute.

41. The method of claim 39, wherein the patterning rate is at least 3.3 meter per minute.

42. The method of claim 39 wherein the width of the line is about 75 nm to 115 nm.

43. The method of claim 39, wherein the lines are separated by a distance about 100 nm.

44. The method of claim 1, wherein the patterning compound is deposited onto the substrate surface at a relative humidity of at least 40%.

45. The method of claim 1, wherein the patterning compound is deposited onto the substrate surface at a relative humidity of at least 70%.

46. The method of claim 1, wherein the patterning compound is deposited onto the substrate surface at a relative humidity of at least 90%.

47. The method of claim 1, wherein the tips are coated by different patterning compositions simultaneously, wherein every second tip is coated by a different patterning composition.

48. The method of claim 47, wherein different patterning compositions are deposited in parallel simultaneously.

49. The method of claim 47, wherein one of the patterning compositions comprises a phospholipid.

50. The method of claim 47, wherein there is substantially no cross-contamination between neighboring tips.

51. A method comprising:
providing a two-dimensional array of a plurality of cantilevers each comprising a tip at a cantilever end, wherein the array is a passive array of cantilevers rather than an active array of cantilevers, and the tips have a tip density of at least 10,000 per square inch and a radius of curvature of less than 100 nm;
disposing a patterning composition on the tips, wherein the composition comprises one or more lipids;
providing a substrate;
depositing at least some of the patterning composition from the tips to the substrate surface to form a lipid bilayer.

* * * * *